(12) United States Patent
Miyasaka

(10) Patent No.: US 10,921,501 B2
(45) Date of Patent: Feb. 16, 2021

(54) INFRARED-LIGHT TRANSMISSION FILTER AND DEVICES CONTAINING THE INFRARED-LIGHT TRANSMISSION FILTER

(71) Applicant: AGC Inc., Chiyoda-ku (JP)

(72) Inventor: Koji Miyasaka, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 794 days.

(21) Appl. No.: 15/650,202

(22) Filed: Jul. 14, 2017

(65) Prior Publication Data

US 2017/0318239 A1     Nov. 2, 2017

Related U.S. Application Data

(63) Continuation of application No. PCT/JP2016/051044, filed on Jan. 14, 2016.

(30) Foreign Application Priority Data

Jan. 19, 2015 (JP) ............... JP2015-007889

(51) Int. Cl.
    *G02B 5/20*      (2006.01)
    *G02B 5/02*      (2006.01)
    (Continued)

(52) U.S. Cl.
    CPC ............ *G02B 5/208* (2013.01); *G01J 5/0205* (2013.01); *G01J 5/0812* (2013.01);
    (Continued)

(58) Field of Classification Search
    CPC ...... H04N 5/332; H04N 5/7441; G02B 5/203; G02B 5/208; G02B 5/0226; G02B 5/0294;
    (Continued)

(56) References Cited

U.S. PATENT DOCUMENTS 6,627,270 B1 *  9/2003  Nishimura ........... G02B 5/3016
                                                            428/1.3
2008/0316594 A1 * 12/2008  Hashiguchi ............ G02B 5/281
                                                            359/359
2015/0192717 A1   7/2015  Katagiri et al.

FOREIGN PATENT DOCUMENTS

| JP | 11-271529 A | 10/1999 |
| JP | 2008-209598 A | 9/2008 |

(Continued)

OTHER PUBLICATIONS

International Search Report dated Mar. 29, 2016 in PCT/JP2016/051044 filed Jan. 14, 2016 (with English translation).

(Continued)

*Primary Examiner* — Jennifer D Bennett
(74) *Attorney, Agent, or Firm* — Oblon, McClelland, Maier & Neustadt, L.L.P.

(57) ABSTRACT

An optical member includes a reflection-scattering unit that reflects and scatters light having a wavelength band which corresponds to at least a portion of a visible wavelength range, and transmits light having a wavelength band which corresponds to at least a portion of an infrared region, wherein rectilinear transmittance for the light having the wavelength band which corresponds to at least the portion of the infrared region is equal to or greater than 75%.

17 Claims, 23 Drawing Sheets

(51) Int. Cl.
*G01J 5/08* (2006.01)
*G02B 5/28* (2006.01)
*G01J 5/02* (2006.01)
*H01L 27/146* (2006.01)
*G01J 5/00* (2006.01)
*H04N 5/33* (2006.01)
*H04N 5/74* (2006.01)

(52) U.S. Cl.
CPC ......... *G02B 5/0226* (2013.01); *G02B 5/0294* (2013.01); *G02B 5/203* (2013.01); *G02B 5/281* (2013.01); *H01L 27/14649* (2013.01); *G01J 2005/0077* (2013.01); *H01L 27/14621* (2013.01); *H04N 5/332* (2013.01); *H04N 5/7441* (2013.01)

(58) Field of Classification Search
CPC ...... G02B 5/281; G01J 5/0812; G01J 5/0205; G01J 2005/0077; H01L 27/14649; H01L 27/14621
See application file for complete search history.

(56) References Cited

FOREIGN PATENT DOCUMENTS

| | | |
|---|---|---|
| JP | 2010-72616 | 4/2010 |
| JP | 2010072616 A * | 4/2010 |
| JP | 2011-53577 | 3/2011 |
| JP | 2013-65052 A | 4/2013 |
| JP | 2014-71295 | 4/2014 |
| WO | WO 2014/050806 A1 | 4/2014 |
| WO | WO 2014/170323 A1 | 10/2014 |

OTHER PUBLICATIONS

Written Opinion dated Mar. 29, 2016 in PCT/JP2016/051044 filed Jan. 14, 2016.
"Plastics-Determination of Haze for Transparent Materials", Japanese Industrial Standard, JIS K 7136:2000, (ISO 14782: 1999), (JPIF/JSA), (with Partial English Translation), 17 pages.
"Glossary of Optical Terms", Japanese Industrial Standard, JIS Z 81 20 : 2001, (JOEM/JSA), Revised Apr. 20, 2001, Investigated by Japanese Industrial Standards Committee, (with Partial English Translation), 141 pages.

* cited by examiner

INFRARED-LIGHT TRANSMISSION FILTER AND DEVICES CONTAINING THE INFRARED-LIGHT TRANSMISSION FILTER

TECHNICAL FIELD

The present invention relates to an optical device using infrared light and an optical member used in the same.

BACKGROUND ART

An optical device using infrared light is used for various purposes, for example, for measurement, communication, biometric authentication, in addition to a use for image capturing, as in an infrared camera device.

Generally, such an optical device includes an infrared-light emitting unit and/or an infrared-light receiving unit. The optical device may have an infrared-light transmission filter provided therein. The infrared-light transmission filter is provided for the purpose of reducing unnecessary light such as visible light, which is incident to the light emitting unit or the light receiving unit and the purpose of making an opening portion of a housing be invisible. Only infrared light is transmitted through the infrared-light transmission filter. The opening portion of the housing is provided for emitting infrared light from the light emitting unit to the outside or for receiving infrared light from the outside to the light receiving unit. Generally, the infrared-light transmission filter blocks visible light, and thus the part for the filter shows a dark color such as black in many cases.

However, an infrared-light transmission filter having a color other than a dark color may be desired, for example, for the purpose of improving design.

As the infrared-light transmission filter having a color other than a dark color, for example, a white color infrared-light transmission filter disclosed in Patent Document 1 or Patent Document 2 is provided. The infrared-light transmission filter disclosed in Patent Document 1 includes a translucent diffusion unit and a mirror configured to transmit infrared light and reflect visible light. Thus, a white color infrared-light transmission filter is realized.

Regarding an infrared-ray transmission filter disclosed in Patent Document 2, fine particles are uniformly dispersed in a transparent binder having a refractive index different from that of the fine particles, and thus transmittance in an infrared region is increased and scattering in a visible wavelength range occurs much. Accordingly, a white color infrared-ray transmission filter is realized.

PRIOR ART REFERENCE

Patent Document

Patent Document 1: JP-A-2014-71295
Patent Document 2: JP-A-2010-72616

SUMMARY OF THE INVENTION

Problems to be Solved by the Invention

However, there is a problem in that transmission and reception sensitivity of infrared light is also decreased in a case where scattering of visible light is increased to enhance design.

Specifically, the method disclosed in Patent Document 1 or Patent Document 2 has a problem in that reduction of haze of infrared light is not possible because, although transmittance for infrared light can be increased, scattering power for infrared light remains. In other words, there is a problem in that rectilinear transmittance of infrared light is not sufficient.

In a case where the light quantity of light which travels rectilinearly is smaller than the light quantity of incident infrared light, loss which is as much as a difference between the light quantities occurs by reflection, absorption, and scattering. In such a case, for example, in a case where combination with a light receiving element, as with an infrared camera is provided, there is a problem in that an image is dark, noise which, for example, makes an image be faint is caused, or sensitivity or characteristics desired as the device are not obtained.

An object of the present invention is to provide an optical device which obtains both of design and high sensitivity for infrared light, and an optical member used for the optical device. Another object of the present invention is to provide an optical member which has high reflection-scattering characteristics for visible light and high rectilinear transmissive characteristics for infrared light.

Solution to the Problems

According to the present invention, there is provided an optical member which includes a reflection-scattering unit that reflects and scatters light having a wavelength band which corresponds to at least a portion of a visible wavelength range, and transmits light having a wavelength band which corresponds to at least a portion of an infrared region. Rectilinear transmittance for the light having the wavelength band which corresponds to at least the portion of the infrared region is equal to or greater than 75%.

The reflection-scattering unit may include a selective reflection unit that reflects the light having a wavelength band which corresponds to at least the portion of the visible wavelength range and transmits the light having a wavelength band which corresponds to at least the portion of the infrared region, and a scattering unit that is provided at least on a first side of the selective reflection unit and scatters the light having the wavelength band which corresponds to at least the portion of the visible wavelength range, the first side being an incident side or an emission side of infrared light and being one predetermined side of sides to which visible light is incident. Here, "being provided on the first side" includes a case of being integrally formed on one side of a target member by using the same member. Hereinafter, the above descriptions are similarly applied to a case of another side.

According to the present invention, there is provided an optical device which includes a light emitting unit configured to emit light having a wavelength band which corresponds to a portion of an infrared region, or a light receiving unit configured to receive light having a wavelength band which corresponds to a portion of the infrared region, a housing configured to enclose the light emitting unit or the light receiving unit, and an infrared-light transmission filter provided at an opening portion of the housing. The infrared-light transmission filter is any of the above-described optical members.

Advantageous Effects of the Invention

According to the present invention, it is possible to provide the optical member which has high reflection-scattering characteristics for visible light and high rectilinear transmissive characteristics for infrared light. According to the present invention, it is possible to provide the optical device which obtains both of design and high sensitivity for infrared light.

BRIEF DESCRIPTION OF THE DRAWINGS

FIG. 3A is a graph illustrating a value of the phase term coefficient when d=270 nm and Δn=0.45 are set, and FIG. 3B is a graph illustrating (0)-th diffraction efficiency of a rectangular diffraction grating by conditions illustrated in FIG. 3A.

FIG. 8A is a cross-sectional view illustrating a configuration example in which the optical member has a convex-concave surface formed on a reflection member, as a scattering unit, and FIG. 8B is an exploded cross-sectional view of the main components of the optical member illustrated in FIG. 8A.

FIG. 9A is a plan view of a concave lens array in which a lens unit having a shape for a plurality of concave lenses is arranged on the convex-concave structure 342$b$ without a gap, and FIG. 9B is a cross-sectional view of a second base member 34$b$ including the convex-concave structure 342$b$ illustrated in FIG. 9A, taken along ling A-A'.

FIG. 10A is a diagram illustrating a case where the angle of inclination cc is greater than 45°, FIG. 10B is a diagram illustrating a case where the angle of inclination α is greater than 0.5×a sin(1/$n_s$), and FIG. 10C is a diagram illustrating a case where inspection light 103 is incident to a base member in which a surface on one side is inclined at an inclination α and an inclination of a surface opposing the above surface is 0°.

FIG. 12A is a cross-sectional view illustrating another configuration example in which the optical member has a convex-concave surface of a reflection member as the scattering unit, and FIG. 12B is an exploded cross-sectional view of the main components of an optical member 40 illustrated in FIG. 12A.

FIG. 13A is a cross-sectional view illustrating a configuration example in which a convex-concave surface is provided not only on a visual recognition side but also on an anti-visual recognition side of a cholesteric-phase liquid crystal layer 43 corresponding to the reflection member, and FIG. 13B is an exploded cross-sectional view of the main components of the optical member 40 illustrated in FIG. 13A.

FIG. 17A is a configuration diagram illustrating an example in which the optical member includes an absorption member, and FIG. 17B is a configuration diagram illustrating an example in which the optical member includes a reflection member.

MODES FOR CARRYING OUT THE INVENTION

Embodiment 1

Figure 1:
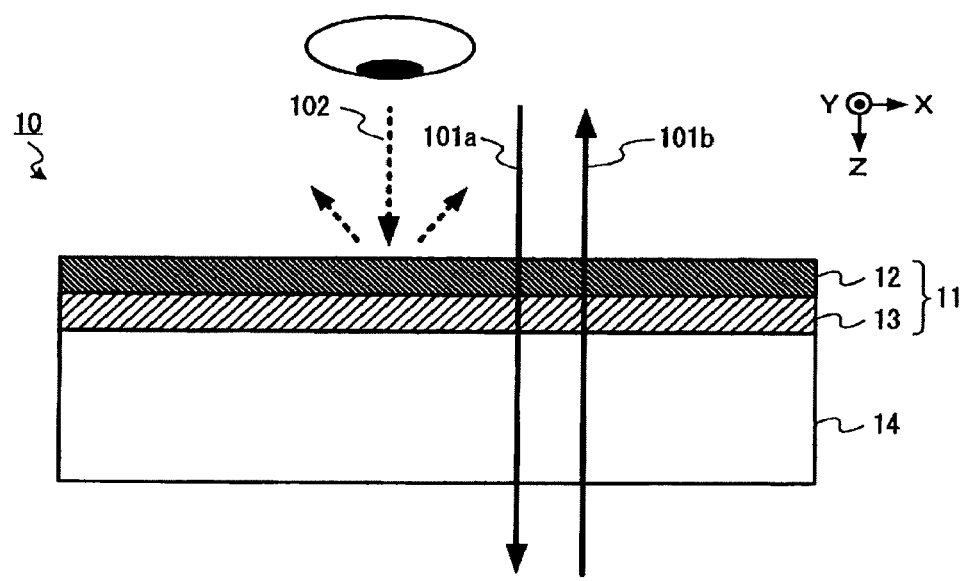
FIG. 1 is a configuration diagram illustrating an example of an optical member according to a first embodiment.

Embodiments of the present invention will be described with reference to the drawings. FIG. 1 is a configuration diagram illustrating an example of an optical member 10 according to a first embodiment of the present invention. The optical member 10 illustrated in FIG. 1 is used as an infrared-light transmission filter to block visible light and transmit infrared light, for example, in an optical device using the infrared light. The optical member 10 reflects and scatters visible light while transmitting infrared light. Thus, when viewed from at least a first side, a light receiving region of visible light is observed to be colored in a color other than a black color. The coloring to be observed is not limited to a solid color, and, for example, includes a combination of a plurality of colors such as a spotted pattern or camouflage. Here, the first side is an incident side or an emission side of infrared light in the optical member 10 and is one predetermined side among sides to which visible light is incident. In the present invention, another side which is not the first side is referred to as a second side. In the following descriptions, although the first side is simply referred to as a view side, and the second side is simply referred to as an anti-visual recognition side, a surface (simply referred to as an observation surface below) in which coloring is observed is not limited to the first side. For example, the anti-visual recognition side (second side) may be also set as the observation surface.

The optical member 10 illustrated in FIG. 1 includes a base member 14, a selective reflection unit 13, and a scattering unit 12. The base member 14 may be arbitrarily provided.

The base member 14 may be configured by a member having transmissive characteristics for infrared light. The base member 14 may be, for example, a substrate produced by using glass, resin, or the like.

The selective reflection unit 13 has a function of reflecting visible light of a predetermined proportion or greater, and transmitting infrared light of a predetermined proportion or greater. Examples of the selective reflection unit 13 include a dichroic mirror and a cholesteric-phase liquid crystal film. More specifically, the selective reflection unit 13 may include a dielectric multilayer film which may be used as a mirror layer of a dichroic mirror or include a reflection member which may be used as a cholesteric-phase liquid crystal film and be referred to as a cholesteric-phase liquid crystal layer.

The scattering unit 12 has a function of exhibiting scattering capability for visible light. The scattering unit 12 preferably has a function of exhibiting scattering capability for visible light, which is larger in comparison to that for infrared light. Implementation examples of the function of exhibiting such scattering capability include a fine particle-containing resin layer, a diffractive structure, and a convex-concave surface provided at a certain medium interface (particularly, reflection member). The fine particle-containing resin layer is a layer formed from resin containing fine particles. For example, the scattering unit 12 may include a member, a structure, or a surface having the function of exhibiting scattering capability, as exemplified as the implementation example.

For example, in a case where the scattering unit 12 includes a diffractive structure, visible light is scattered by using a diffraction phenomenon. For example, in a case where the scattering unit 12 has a convex-concave surface formed on a certain medium interface, visible light is scattered by using a reflection and refraction phenomenon on the convex-concave surface. In particular, in a case where the scattering unit 12 has a convex-concave surface provided on a reflection member, visible light can be scattered much because the quantity of deflection of rays in reflection is greater than that in refraction. For example, in a case where the scattering unit 12 includes a fine particle-containing resin layer, visible light is scattered by mainly using a refraction phenomenon at an interface with fine particles in a resin layer as a binder.

In the present invention, visible light may be light having a wavelength of 400 to 750 nm. Infrared light may be set to be light having a wavelength of 800 nm or more. For example, in a case where a visible wavelength range (tinge) in which an occurrence of reflection and scattering is desired, a detection wavelength band of an infrared sensor, or the like is determined, a target wavelength band in the above range for the visible light or the infrared light may be further limited. In a case where the particular statement is not made, a visible wavelength range is correspond to a wavelength of 400 to 780 nm, and an infrared region is set to correspond to a wavelength of 780 to 2000 nm which is a range of a near infrared region. In particular, the infrared region is set to correspond to a wavelength of 800 to 1,000 nm. The visible light is set to be light in the visible wavelength range and the infrared light is set to be light in the infrared region.

In the embodiment, the scattering unit 12 may be provided on a visual recognition side (first side) of the selective reflection unit 13. That is, when viewed from the visual recognition side (first side), the selective reflection unit 13 and the scattering unit 12 may be provided in an order of the scattering unit 12 and the selective reflection unit 13. In a case where visible light is also incident from the anti-visual recognition side (second side), the scattering unit 12 may be provided on both sides of the selective reflection unit 13.

Although FIG. 1 illustrates that the selective reflection unit 13 is configured by a member which is different from a member constituting the scattering unit 12, and the selective reflection unit 13 is in contact with the scattering unit 12, for example, some of members constituting the selective reflection unit 13 may constitute the scattering unit 12 (for example, diffractive structure or convex-concave surface). That is, the selective reflection unit 13 and the scattering unit 12 may be integrally formed by the same member, for example. For example, a configuration in which the selective reflection unit 13 is provided in the base member 14, that is, the selective reflection unit 13 is interposed between two base members 14 or a configuration of being provided on the anti-visual recognition side of the base member 14 may be made. Another functional layer may be provided between the selective reflection unit 13 and the scattering unit 12, and thus the selective reflection unit 13 and the scattering unit 12 may not be in contact with each other.

In a case where the selective reflection unit 13 is not in contact with the scattering unit 12, a distance between the selective reflection unit 13 and the scattering unit 12 is preferably short. In particular, in a case where the scattering unit 12 is configured by a diffractive structure, specifically, the distance is preferably equal to or smaller than 3 μm. If the distance between the selective reflection unit 13 and the scattering unit 12 is too long, a coefficient of a phase term for reflected light of visible light is shifted from 2Δnd/λ which will be described later. Thus, this case is not preferable.

A combination of the scattering unit 12 and the selective reflection unit 13 may be referred to as a reflection-scattering unit 11. In this case, the reflection-scattering unit 11 has a function of reflecting and scattering visible light of a predetermined proportion or greater, and rectilinearly transmitting infrared light of a predetermined proportion or greater.

In the example illustrated in FIG. 1, visible light 102 is incident to the optical member 10 from the visual recognition side of the optical member 10 in a +z direction. Infrared light may be incident to the optical member 10 from the visual recognition side of the optical member 10 in the +z direction or may be incident from the anti-visual recognition side in a -z direction. In FIG. 1, infrared light 101a is an example of the former, and infrared light 101b is an example of the latter.

For example, if the visible light 102 is incident to the optical member 10, the visible light 102 is reflected and scattered by the scattering unit 12 and the selective reflection unit 13. Thus, the optical member 10 is viewed to be colored. In a case where the infrared light 101a is incident to the optical member 10, a portion of the infrared light 101a is scattered by the scattering unit 12, but most of the components thereof are rectilinearly transmitted and are transmitted through the selective reflection unit 13, as they are. In a case where the infrared light 101b is incident to the optical member 10, the infrared light 101b is transmitted through the selective reflection unit 13. Then, a portion of the infrared light 101b is scattered by the scattering unit 12, but most of the components thereof are rectilinearly transmitted and are transmitted through the scattering unit 12.

As described above, the visible light 102 is transmitted through the scattering unit 12 and is reflected by the selective reflection unit 13, and thereby there are cases when the visible light passes through the scattering unit 12 twice. On the contrary, the infrared light 101a and the infrared light 101b pass through the scattering unit 12 only once. Accordingly, the optical member 10 allows the visible light 102 to be scattered more in comparison to the infrared light 101a and the infrared light 101b. In a case where a reflection member having a convex-concave surface is used as the reflection-scattering unit 11, larger scattering is obtained by using a reflection surface. This has the same meaning that scattering for the infrared light 101a and the infrared light 101b can be reduced in comparison to the visible light 102. Thus, the optical member 10 can rectilinearly transmit the infrared light 101a and the infrared light 101b more while scattering the visible light 102.

In a case where the optical member 10 uses a diffractive structure as the scattering unit 12, $\Delta nd/\lambda$ which is a coefficient of a phase term for diffracted light of transmission of one time may be adjusted. More specifically, a difference $\Delta n$ of a refractive index and a height d of the diffractive structure are adjusted, and thus it is possible to increase the light quantity of a rectilinear component (zero order diffraction light) of infrared light and to decrease the light quantity of a rectilinear component (zero order diffraction light) of visible light in the scattering unit 12.

In a case where fine particle-containing resin is used for the scattering unit 12, a particle diameter of fine particles or a ratio of a refractive index of the fine particles to that of a resin material as a binder is adjusted. Thus, the scattering unit 12 can increase the amount of scattered visible light and reduce the amount of scattered infrared light, as the reflection-scattering unit 11. The extent of scattering may be determined by a haze which is an index indicating a proportion of diffusion transmittance to total light transmittance.

A more specific configuration example of the reflection-scattering unit will be described below.

Figure 2:
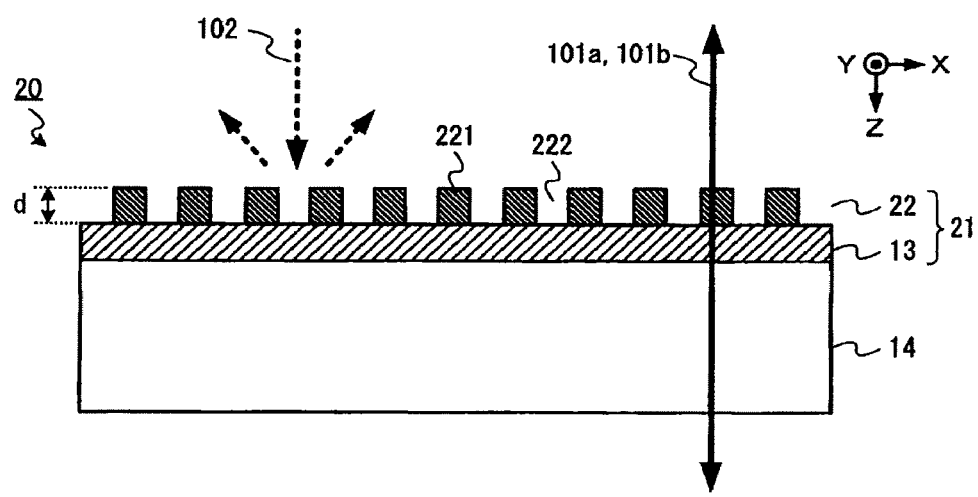
FIG. 2 is a cross-sectional view illustrating another example of the optical member.

Firstly, an example in which a diffractive structure is used in the scattering unit 12 will be described. FIG. 2 is a cross-sectional view illustrating an optical member which includes a diffractive structure as the scattering unit. An optical member 20 illustrated in FIG. 2 includes the base member 14 and a reflection-scattering unit 21. The reflection-scattering unit 21 includes the selective reflection unit 13 and a diffractive structure 22.

The diffractive structure 22 exhibits a diffraction action on at least visible light. The specific configuration of the diffractive structure 22 is not limited to a certain structure as long as the diffractive structure 22 is a structure which allows exhibition of the diffraction action on infrared light to be performed less than that on visible light. In FIG. 2, a convex-concave structure having a rectangular cross-section is illustrated as the diffractive structure 22. The diffractive structure 22 is not limited to the convex-concave structure having a rectangular cross-section.

In FIG. 2, a difference of a refractive index between a concave portion 222 and a convex portion 221 of the diffractive structure 22 is set as $\Delta n$, a wavelength of incident light is set as $\lambda$, and the height of the convex portion 221 or the depth of the concave portion 222 is set as d. Diffraction characteristics of the diffractive structure 22 varies depending on $\Delta nd/\lambda$ which is a coefficient of a phase term for an electric field in the diffractive structure 22.

Here, regarding the visible light 102 which is reflected light, because the visible light 102 goes and comes to and from the diffractive structure 22, the coefficient is calculated as $2\Delta nd/\lambda$. Regarding the infrared light 101a and the infrared light 101b which are transmitted light the coefficient is calculated as $\Delta nd/\lambda$ because the infrared light 101a and the infrared light 101b are transmitted once through the diffractive structure 22. The light quantity of zero order diffraction light is decreased as the value of the coefficient approaches a value such as 0.5 which is a value obtained by multiplying an odd number by ½. The light quantity of the zero order diffraction light is increased as the value of the coefficient approaches an integer such as 0 or 1. The decrease or the increase is determined in accordance with an interference condition.

Figure 3A:
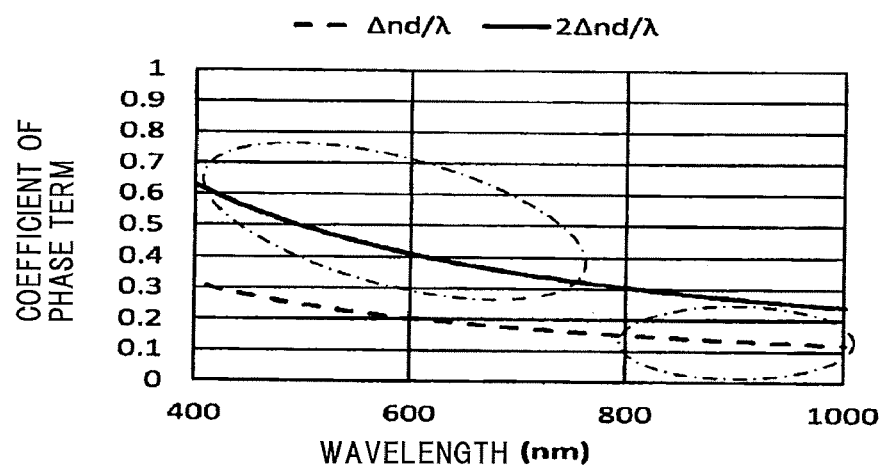
FIGS. 3A and 3B are graphs illustrating an example of wavelength dependency of a phase term coefficient in a diffractive structure 22.

FIG. 3A is a graph illustrating an example of wavelength dependency of the coefficients. The graph illustrated in FIG. 3A indicates values of the coefficients when d=270 nm and $\Delta n$=0.45 are set. In FIG. 3A, a horizontal axis indicates a wavelength [nm] and a vertical axis indicates the value of the coefficient of the phase term. As illustrated in FIG. 3A, $\Delta nd/\lambda$ (characteristics indicated by a broken line) which is the coefficient of the phase term for transmission has a value (about 0.15 to 0.12) approximate to 0 in a case of infrared light. $2\Delta nd/\lambda$ (characteristics indicated by a solid line) which is the coefficient of the phase term for reflection has a value (about 0.3 to 0.6) approximate to 0.5 in a case of visible light. Thus, the optical member 20 can decrease the light quantity of reflection zero order diffraction light with respect to incident visible light and can increase the light quantity of transmission zero order diffraction light with respect to incident infrared light.

Figure 3B:
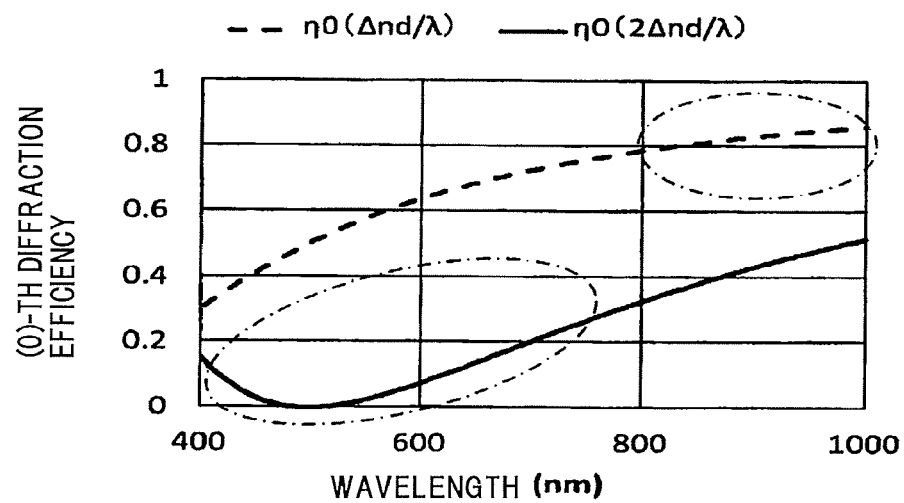

FIG. 3B is a graph illustrating (0)-th diffraction efficiency of a rectangular diffraction grating in accordance with a condition illustrated in FIG. 3A. The (0)-th diffraction efficiency of the rectangular diffraction grating, that is, a proportion of a rectilinearly-transmitting component to incident light can be calculated by $\cos(\pi\varphi)^2$ when the coefficient of the phase term is set as $\varphi$. FIG. 3B illustrates results obtained by calculating (0)-th diffraction efficiency $\eta 0$ in a case where $\varphi$ is set to be $\Delta nd/\lambda$ which is the coefficient of the phase term at a time of one time passing (transmission), and in a case where $\varphi$ is set to be $2\Delta nd/\lambda$ which is the coefficient of the phase term at a time of passing twice (reflection). As illustrated in FIG. 3B, it is possible to reduce the reflection-(0)th-diffraction efficiency determined by $2\Delta nd/\lambda$ (characteristics indicated by a solid line) which is the coefficient of the phase term for reflection, up to being smaller than 30% regarding visible light, it is possible to set transmission-(0)th diffraction efficiency determined by $\Delta nd/\lambda$ which is the coefficient of the phase term for transmission, to be equal to or greater than about 80% regarding infrared light.

The concave portion 222 may be filled with a material other than an air. In this case, it is preferable that the convex portion 221 is formed from a multilayer film which has a reflection band in the vicinity of the infrared region or formed from a material containing a dye or a pigment which performs absorption in the vicinity of the infrared region (between the visible wavelength range and the infrared region or a side of a wavelength longer than a target wavelength band of the infrared region). In addition, it is preferable that the concave portion 222 is filled with a material having a refractive index in the infrared region (in particular, target wavelength band) which is close to or the same as that of the above material. Generally, abnormal dispersion of a refractive index occurs in a multilayer film having a reflection band or a material performing absorption. In particular, a refractive index in the vicinity of the reflection band or an absorption band is largely changed. If such characteristics are used, a difference of a refractive index between a target wavelength band of the visible wavelength range and a target wavelength band of the infrared region can be adjusted to be increased. The diffraction action may be performed only on visible light as long as the diffractive structure 22 is adjusted to be formed of a combination of the above-described material and a material having a refractive index in at least the target wavelength band of the infrared region, which is substantially the same as that of this material.

The diffractive structure 22 is preferably able to impart a two-dimensional scattering action, for example, in which light (particularly, visible light) is deflected, for example, in an X direction and a Y direction (component) by a diffraction action. For example, the diffractive structure 22 may be a two-dimensional convex-concave structure as illustrated in FIG. 4.

Figure 4:
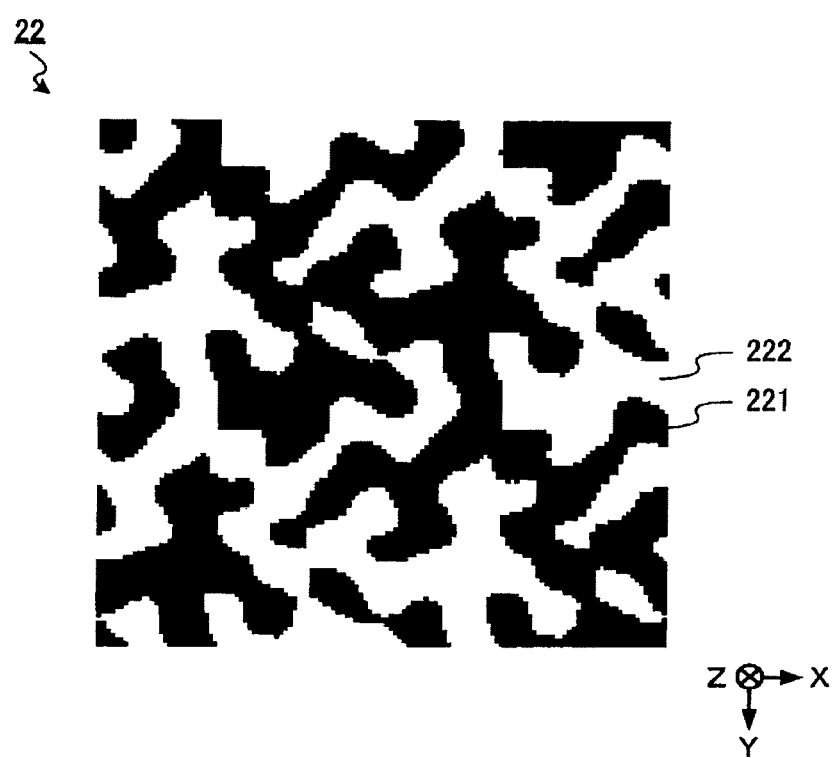
FIG. 4 is a plan view illustrating an example of the diffractive structure 22.

FIG. 4 is a plan view illustrating an example of the diffractive structure 22. In FIG. 4, a white portion indicates the concave portion 222 and a black portion indicates the convex portion 221. The height of the black portion based on the white portion as the reference is set to be d. A convex-concave structure illustrated in FIG. 4 is an example of a part of the diffractive structure 22. The diffractive structure 22 may be made in a manner that, for example, a unit having the convex-concave structure as illustrated in FIG. 4 is periodically and two-dimensionally arranged (for example, in the X direction and the Y direction) without a gap. The diffractive structure 22 is not limited to a periodic structure of one kind of convex-concave structure, and may be made, for example, in a manner that two kinds or more of convex-concave structures which are different from each other are two-dimensionally arranged without a gap.

Figure 5:
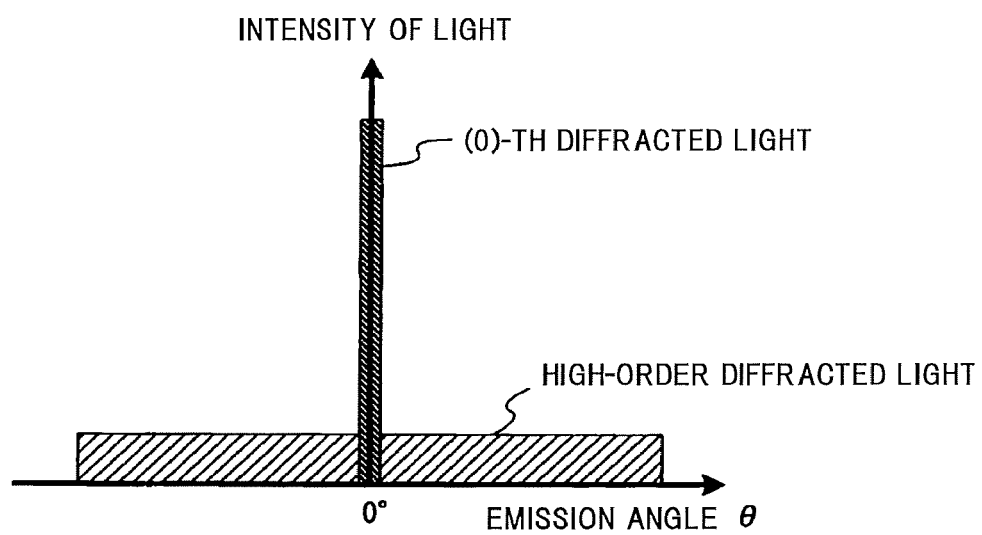
FIG. 5 is a graph illustrating an example of angle dependency in light quantity distribution of a transmission component of infrared light by the diffractive structure 22.

FIG. 5 is a graph illustrating angle dependency of light quantity distribution of a transmission component by the diffractive structure 22, on incidence of infrared light. In FIG. 5, a horizontal axis indicates an emission angle θ [°] of the transmission component and a vertical axis indicates light intensity. Generally, if light is incident to the diffractive structure having a function of exhibiting the diffraction action, the light is roughly divided into two kinds of diffraction light which are 0th diffraction light and so-called diffraction light, that is, high-order diffraction light. The 0th diffraction light is light which is rectilinearly transmitted. The high-order diffraction light is deflected light which travels in a direction other than a rectilinear direction. Generally, the 0th diffraction light has intensity which is sufficiently stronger than that of the high-order diffraction light. Thus, even if infrared light is incident to the diffractive structure 22 and high-order diffraction light is generated, high contrast as illustrated in FIG. 5 is easily obtained.

In a case where a ratio of the light quantity of the 0th diffraction light to the light quantity of incident light of infrared light in the optical member 20 is set as $T_0$, the diffractive structure 22 is preferably adjusted so as $T_0$ to be equal to or greater than 75%. To is preferably equal to or greater than 75%, more preferably equal to or greater than 85%, further preferably equal to or greater than 90%, and most preferably equal to or greater than 95%. "The 0th diffraction light" in this case does not include reflection 0th diffraction light. In the following descriptions, in a case where infrared light is referred to as "0th diffraction light", the 0th diffraction light in transmitted light is indicated. A haze value may be used instead of $T_0$. In this case, the haze value of infrared light in the optical member 20 is preferably smaller than 25%, more preferably smaller than 15%, further preferably smaller than 10%, and most preferably smaller than 5%. As described in JIS K 7136, the haze value may be obtained as a percentage of transmitted light which is shifted from incident light at 0.044 rad (2.5°) or larger by forward scattering, to transmitted light which is transmitted through a test piece. Although an angle range corresponding to rectilinearly-transmitted light is within 2.5° in JIS K 7136, as described in examples which will be described later, transmitted light having an angle range (for example, being equal to or smaller than) 1.5° narrower than a range of 2.5° may be used as rectilinearly-transmitted light.

Figure 6:
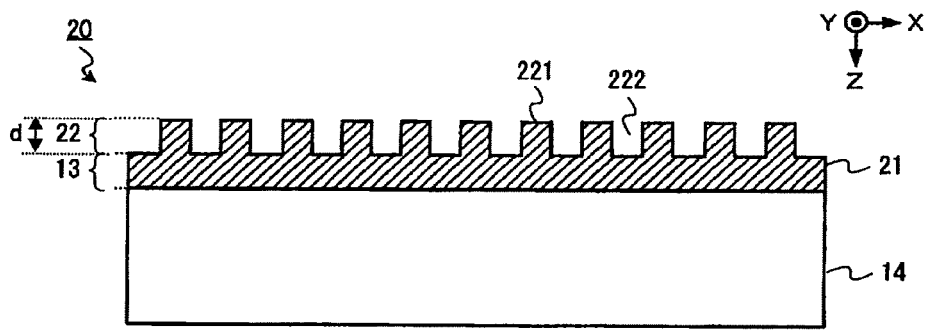
FIG. 6 is a cross-sectional view illustrating still another example of the optical member.

As illustrated in FIG. 6, in the optical member 20, the selective reflection unit 13 and the diffractive structure 22 may be integrally formed, for example, in a manner that a groove is provided on the surface of the selective reflection unit 13 and is used as the material of the convex portion 221. In this case, it is possible to reduce the quantity of reflection when light is incident from the diffractive structure 22 (more specifically, convex portion 221) to the selective reflection unit 13, and rectilinear transmittance of infrared light is improved.

In a case where a ratio of the total light quantity of high-order diffraction light to the light quantity of incident light of infrared light in the optical member 20 is set as $T_1$, and $T_1'=T_1/(T_0+T_1)\times 100[\%]$ is set, the diffractive structure 22 is preferably adjusted so as to cause $T_1'$ to be equal to or smaller than 10%. Although $T_1'$ is preferably equal to or smaller than 10%, $T_1'$ is more preferably equal to or smaller than 5%, and is further preferably equal to or smaller than 2%. The "high-order diffraction light" does not include a reflection components. In the following descriptions, in a case where infrared light is referred to as "high-order diffraction light", diffraction light other than 0th diffraction light among transmission components, that is, first diffraction light, second diffraction light, third diffraction light, or the like is indicated.

Figure 7:
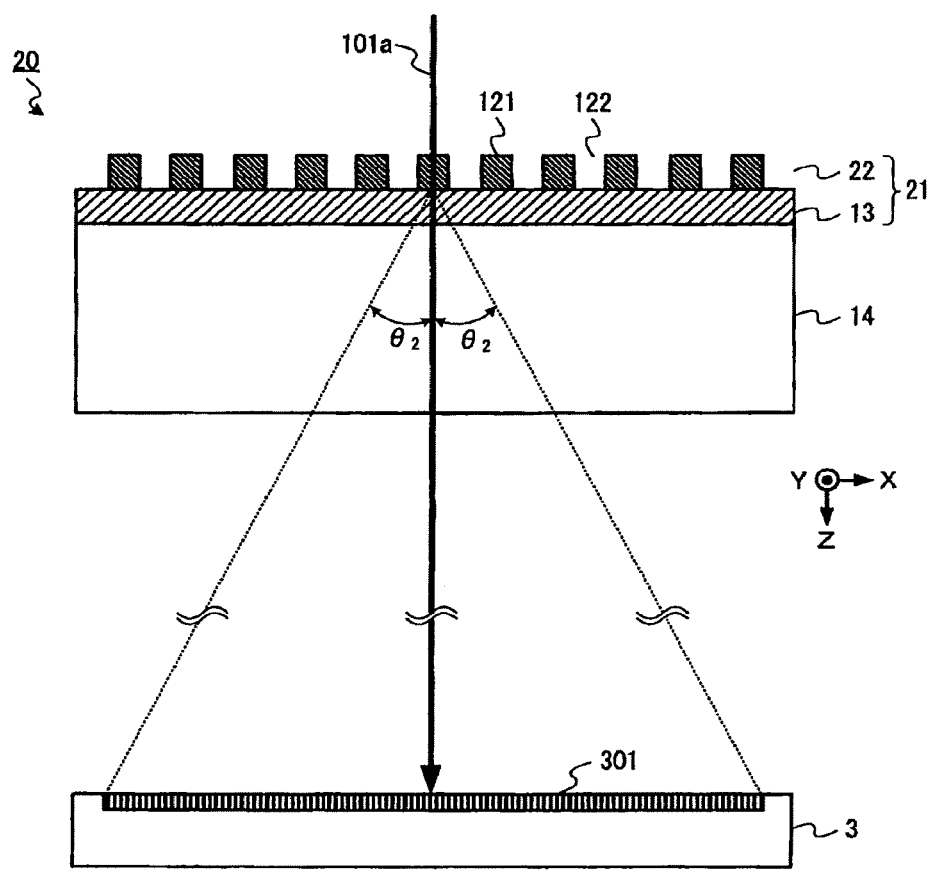
FIG. 7 is a diagram illustrating an example of a method of measuring light quantity density of scattered light.

When $T_1$ is measured, there is a case that all portions of transmitted light are not measured, but light emitted within a predetermined angle is measured, and thus a comparison of light quantity density may be easily performed. For example, as illustrated in FIG. 7, if an angle which is measured at a predetermined position (for example, from the center of an optical axis of incident light) on an emission surface of the diffractive structure 22 and is an angle from the optical axis to an end portion of an effective area 301 of an infrared-light receiving unit 3 is set as $\theta_2$, $T_1$ may be measured by using only diffraction light emitted within the angle $\theta_2$, as the target. An emission surface of the optical member 20 may be used instead of the emission surface of the diffractive structure 22. As described above, in a case where an angle of transmitted light is limited and $\theta_2$ is set to be equal to or smaller than 10°, $T_1'$ is preferably equal to or smaller than 3%, more preferably equal to or smaller than 2%, and further preferably equal to or smaller than 1%.

Generally, in a case where high-order diffraction light is generated, and the number of rays of high-order diffraction light generated by the diffractive structure 22 is set as N, the light quantity of the high-order diffraction light can be approximately reduced in proportion to 1/N. The number of rays N of the generated high-order diffraction light is preferably equal to or greater than 100 and more preferably equal to or greater than 1,000 because of being able to increase scattering characteristics. Generally, if a diffraction angle by the high-order diffraction light is set to be large, it is possible to reduce the size (grating pitch) of the convex-concave structure. Thus, it is possible to improve uniformity in a case where an element surface is visually recognized. Thus, regarding diffraction characteristics by the diffractive structure 22 alone, the full width at half maximum (hereinafter, FWHM) of light quantity distribution of high-order diffraction light of visible light is preferably equal to or greater than 5°, more preferably equal to or greater than 10°, and further preferably equal to or greater than 20°.

Figure 8A:
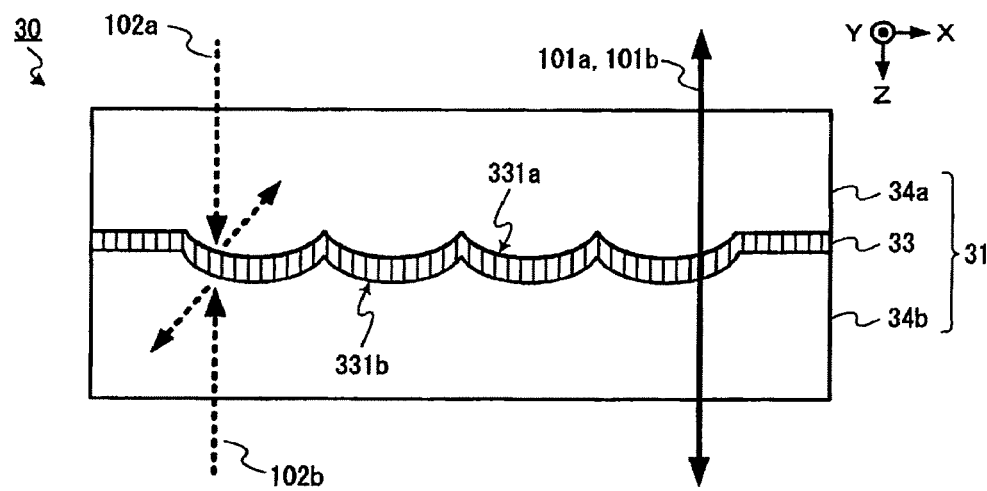
FIGS. 8A and 8B are configuration diagrams illustrating still another example of the optical member.
Figure 8B:
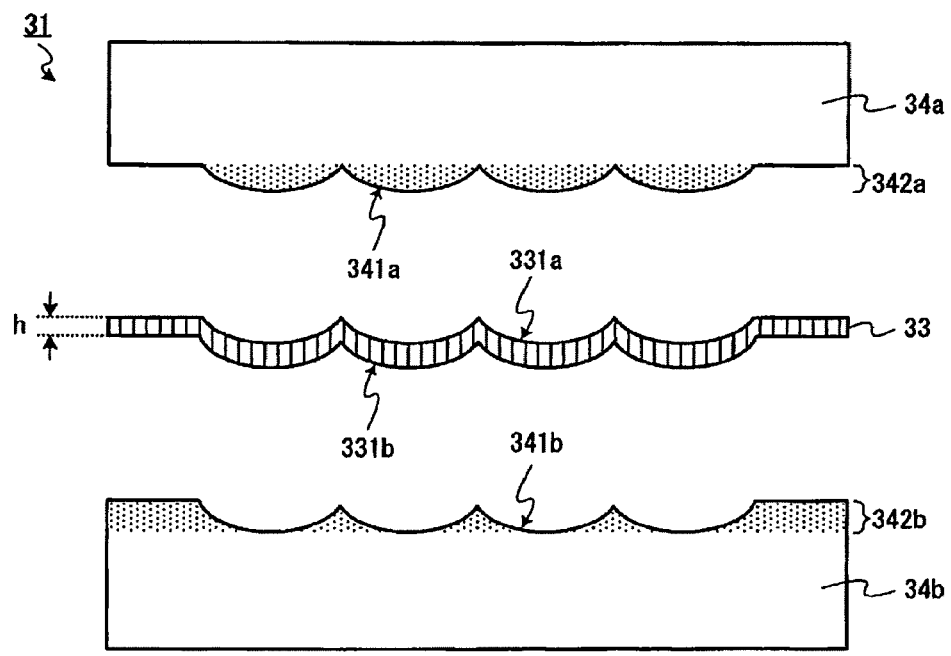

Next, an example in a case where a convex-concave surface different from a diffraction grating structure is used as the scattering unit 12 will be described. FIG. 8A is a cross-sectional view illustrating a configuration example in which the optical member has a convex-concave surface formed on the reflection member, as the scattering unit. The convex-concave surface of the reflection member may be obtained by imitating a convex-concave surface of a base member (first base member 34a, second base member 34b, or the like) as a base. FIG. 8B is an exploded cross-sectional view of the main components of an optical member 30 illustrated in FIG. 8A. The optical member 30 illustrated in FIG. 8A includes a reflection-scattering unit 31. The reflection-scattering unit 31 includes a selective reflection film 33 as the reflection member, a first base member 34a, and a second base member 34b.

A surface (XY plane) of the selective reflection film 33 on a visual recognition side in this example is formed to be a convex-concave surface. A surface of the selective reflection film 33 on an anti-visual recognition side in this example is also formed to be a convex-concave surface. A surface of the first base member 34a positioned on the visual recognition side (first side) when viewed from the selective reflection film 33, on a side thereof which is in contact with the selective reflection film 33 is formed to be a convex-concave surface. In addition, a surface of the second base member 34b positioned on the anti-visual recognition side (second side) when viewed from the selective reflection film 33, on a side thereof which is in contact with the selective reflection film 33 is also formed to be a convex-concave surface. In the following descriptions, the convex-concave surface of the selective reflection film 33 on the visual recognition side may be referred to as a convex-concave surface 331a, and the convex-concave surface of the selective reflection film 33 on the anti-visual recognition side may be referred to as a convex-concave surface 331b. The convex-concave surface of the first base member 34a on the side being in contact with the selective reflection film 33 may be referred to as a convex-concave surface 341a, and the convex-concave surface of the second base member 34b on the side being in contact with the selective reflection film 33 may be referred to as a convex-concave surface 341b.

Although the selective reflection film 33 is provided as the reflection member of the selective reflection unit in the example illustrated in FIG. 8A, the convex-concave surface 331a of the selective reflection film 33 on the visual recognition side corresponds to a convex-concave surface acting as the scattering unit. The convex-concave surface 331a of such a selective reflection film 33 may be formed, for example, in a manner that a convex-concave surface is formed by forming a convex-concave structure on one surface of a base member (for example, surface of the first base member 34a or surface of the second base member 34b) and a dielectric multilayer film having a substantially uniform film thickness h is formed (layered) on the convex-concave surface. According to the method, the convex-concave surface 331b can be simultaneously formed on the visual recognition side and the anti-visual recognition side of the selective reflection film 33. Thus, coloring can be observed in a case where visible light is incident from the anti-visual recognition side in addition to the visual recognition side (see visible light 102a and visible light 102b in FIG. 8A).

In this example, the other base member is further stacked on the convex-concave surface of the selective reflection film 33, which is stacked on a convex-concave surface of one base member. At this time, a convex-concave surface of the other base member on the selective reflection film 33 and the convex-concave surface of the selective reflection film 33 have shapes which are fit with each other. In a convex-concave structure having such a convex-concave surface of the base member, for example, the concave portion of the convex-concave surface of the selective reflection film 33 may be filled with the material (for example, resin or the like) of the base member. Here, as a state of layering the first base member 34a, the selective reflection film 33, and the second base member 34b, the first base member 34a, the selective reflection film 33, and the second base member 34b may be arranged to be close to each other in a state of no gap. Specifically, a case where the first base material 34a, the selective reflection film 33, and the second base material 34b indirectly come into contact with each other, for example, a case where an adhesive layer or a thin film functioning as another functional film having a film thickness which is within tens μm (within 100 μm) is provided between the first base material 34a, the selective reflection film 33, and the second base material 34b is also included in addition to a case where the first base material 34a, the selective reflection film 33, and the second base material 34b directly come into contact with each other. The function of the thin film is not particularly limited. In the following descriptions, as described above, an expression of "being in contact" may be simply described in the above-described cases which includes a case of indirectly being in contact with each other in a state where the total film thickness is within 100 μm.

The first base member 34a may have transmissive characteristics for visible light and infrared light. Similar to the base member 14, the second base member 34b may have transmissive characteristics for at least infrared light. In a case where the anti-visual recognition side of the optical member 30 is also set as the observation surface, the second base member 34b may have transmissive characteristics for visible light and infrared light.

In addition, in this example, the first base member 34a and the second base member 34b which are members being in contact with the convex-concave surface of the selective reflection film 33 may have substantially the same refractive index in a target wavelength band of at least the infrared region. Here, regarding a state where the refractive index is substantially the same, a difference of the refractive index between two materials in the target wavelength band or an average value of the refractive indices is preferably equal to or smaller than 0.05 and more preferably equal to or smaller than 0.005. In the following descriptions, it is assumed that the sameness of the refractive index is applied similarly to the above descriptions.

The selective reflection film 33 may be configured to reflect visible light of a predetermined proportion or greater and to transmit infrared light of a predetermined proportion or greater. Examples of the selective reflection film 33 include a dielectric multilayer film and a cholesteric-phase liquid crystal film. Here, the dielectric multilayer film may include metal or a semiconductor material. In this case, a material which absorbs the small quantity of infrared light may be used as the semiconductor material. A metal material may be sufficiently thin as long as transmittance for infrared light is not low.

With this configuration, large scattering for the visible light 102*a* and 102*b* is obtained by using an inclined reflection surface. In addition, since refractive indices of at least a convex-concave structure portion (see 342*a* and 342*b* in FIG. 8B) of both members (first base member 34*a* and second base member 34*b*) being in contact with the selective reflection film 33 are substantially the same as each other, the infrared light 101*a* and 101*b* is emitted from an emission interface of the optical member 30 without large refraction. This is because this configuration is a configuration in which a difference of the length of an optical path for infrared light due to a difference of a position in an incident aperture does not occur or the difference is suppressed to be small even if the difference occurs.

In this example, the convex-concave surface 341*a* of the first base member 34*a* and/or the convex-concave surface 341*b* of the second base member 34*b* may be a rough surface formed by sandblasting and the like. A shape having a lot of smooth curved surface (including freely-curved surface, aspherical surface, and spherical surface) is more preferable. Generally, a rough surface formed by sandblasting and the like has a shape in which a derived function has a lot of discontinuous points. Thus, for example, in a case where a dielectric multilayer film is formed as the selective reflection film 33, the multilayer film may not be allowed to be formed to have an uniform thickness and may not show desired characteristics.

Examples of the convex-concave structures 342*a* and 342*b* including a lot of smooth curved surface includes a lens array in which multiple fine spherical surfaces or multiple fine aspherical surfaces are arranged and a prism array in which multiple prisms are arranged. The lens or the prism in the array is not limited to one kind thereof and plural kinds of lenses or prisms may be provided. The lenses or the prisms may be regularly or irregularly arranged. Other examples include a convex-concave portion of a frost plate in which a rough surface of a base member, which is formed by sandblasting and the like is etched with hydrofluoric acid and the like so as to smoothen the surface, and a convex-concave portion of a resin layer able to be obtained in a manner that a convex-concave portion of a diffusion element of such a frost plate or the like is transferred onto the resin layer or the like of a base member.

In a case where a dielectric multilayer film is formed as the selective reflection film 33, the thickness of the multilayer film may be several µm. Thus, when the dielectric multilayer film is formed on the convex-concave surface of the base member, if the width w of each concave portion constituting the convex-concave surface of the base member (length of a straight line linking an end point of the concave portion through the bottom portion of the concave portion, in a surface direction) is too small, each layer may be not allowed to be formed to have a desired thickness. Accordingly, in the convex-concave surface of at least one base member among the first base member 34*a* and the second base member 34*b*, a region in which the width w of the concave portion is smaller than 5 µm is preferably smaller than 10% of the entirety of the effective area to which visible light is incident. The width w of all concave portions in the effective area is more preferably equal to or greater than 5 µm. In a case where the convex-concave surface includes a convex portion, it is preferable that the convex portion satisfies the above condition. That is, it is more preferable that a region in which the width w of a convex portion is smaller than 5 µm is smaller than 10% of the entirety of the effective area to which visible light is incident. It is further preferable that the width w of all convex portions in the effective area is equal to or greater than 5 µm. The description of the width w of the convex portion may be made by replacing the bottom portion of the concave portion with the peak portion of the convex portion in the description of the width w of the concave portion.

In a case where particular statement is not made, the concave portion constituting the convex-concave surface is a region which includes a concave vertex and does not include a convex vertex or a region which includes a convex vertex as a boundary portion. In particular, the concave portion is a region surrounded by a convex ridgeline. The convex portion is a region which includes a convex vertex and does not include a concave vertex or a region which includes a concave vertex as a boundary portion. In particular, the convex portion is a region surrounded by a concave ridgeline. In a case of referring to the bottom portion of the concave portion, the concave ridgeline of the concave portion is also included in addition to the concave vertex thereof. In a case of referring to the peak portion of the convex portion, the convex ridgeline of the convex portion is also included in addition to the convex vertex thereof. In a case where the boundary between the concave portion and the convex portion is ambiguous, for example, in a case where the shape of the cross-section of the convex-concave structure is a SIN curved shape or a freely-curved surface or a convex-concave is formed to have multiple steps, an inflection point of the cross-section may be set as the boundary between the concave portion and the convex portion in the cross-section. In addition, the least square plane for a convex-concave structure forming the convex-concave surface is obtained, a portion thereof positioned under the least square curved surface may be set to be the concave portion, and a portion thereof positioned over the least square curved surface may be set to be the convex portion.

Figure 9A:
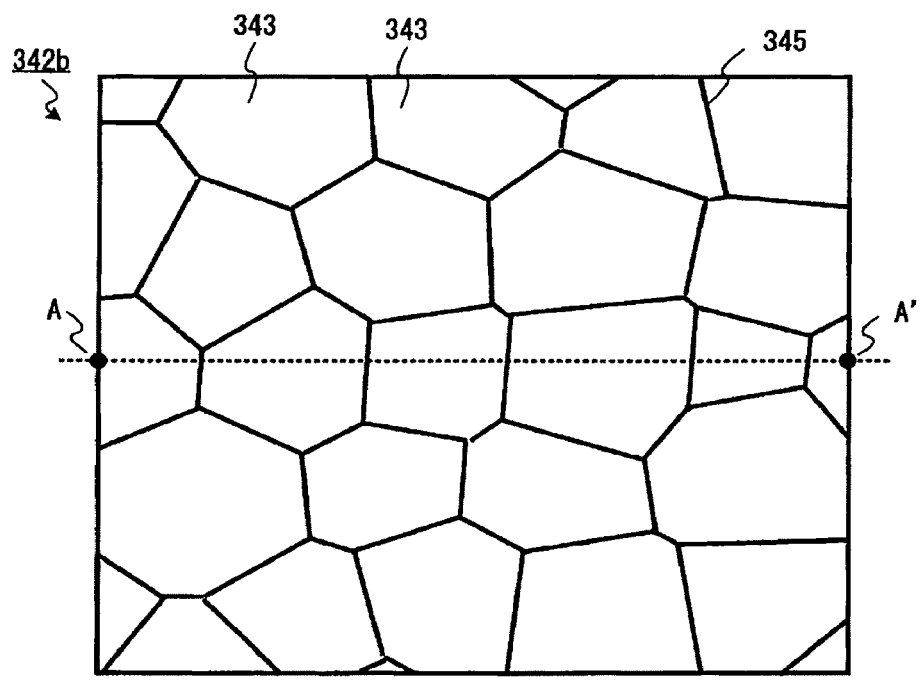
FIGS. 9A and 9B are diagrams illustrating a convex-concave structure 342$b$.
Figure 9B:
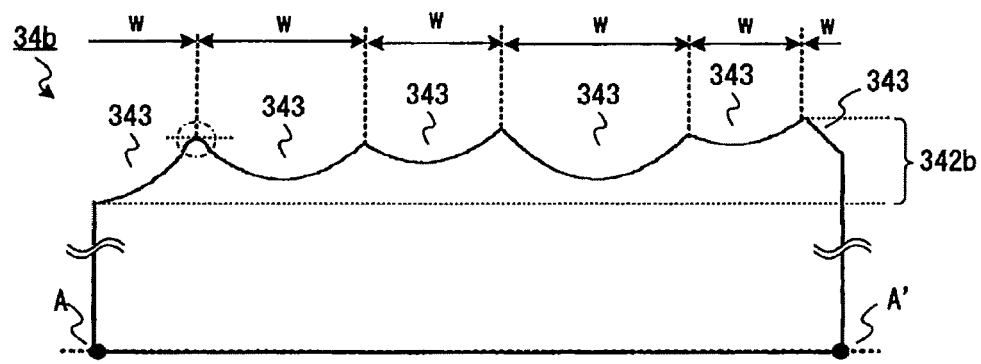

As illustrated in FIG. 9A, in a case where a convex-concave structure (in the example of FIG. 9A, convex-concave structure 342*b*) forming the convex-concave surface of the base member which is set as a film formation target is a concave lens array obtained in a manner that lens units 343 having a shape of a plurality of concave lenses are arranged without a gap, each of the lens units 343 may be set as the concave portion. In this case, the convex-concave surface may be formed only by concave portions. If the convex-concave surface is formed in this manner, a ridgeline 345 between the lens units 343, which corresponds to a boundary portion between adjacent lens units 343 is observed from an upper surface of the base member, and thus the width w of each of the concave portions can be obtained. Here, in a case where the boundary portion of the lens unit 343 has a curvature as with a region surrounded by a dashed line in FIG. 9A, a position at which an inclination is 0 may be set as a vertex of the boundary portion and a ridgeline formed by a vertex group may be observed from the upper surface of the base member. FIG. 9A is a plan view illustrating a part obtained by cutting a portion of the convex-concave structure 342b. FIG. 9B is a cross-sectional view of the second base member 34b having the convex-concave structure 342b illustrated in FIG. 9A, taken along line A-A'.

The convex-concave structure forming the convex-concave surface may be a convex lens array obtained in a manner that lens units 343 having a shape of a convex lens are arranged without a gap. In this case, each of the lens units 343 may be set as the convex portion. In this case, the convex-concave surface may be formed only by convex portions. If the convex-concave surface is formed in this manner, a ridgeline 345 between the lens units 343, which corresponds to a boundary portion between adjacent lens units 343 is observed from an upper surface of the base member, and thus the width w of each of the convex portions can be obtained. As described above, the lens array is not limited to have regular arrangement. The lens array includes a lens array having an irregular lens shape and irregular arrangement. Instead of the lens unit 343, a case of a convex prism array in which convex prisms are arranged or a case of a concave prism array in which concave prisms are arranged may be similar to the case of the lens array. In the example illustrated in FIG. 9A, the convex-concave structure 342b is exemplified as the convex-concave structure forming the convex-concave surface of a base member, which is a film formation target. However, the convex-concave structure 342a may be provided as the convex-concave structure. In this case, the convex-concave surface 341a side may be caused to be upwardly directed, and it may be determined whether the convex-concave surface is convex or concave.

In a case where the shape of the concave portion is not a closed-shape, for example, in a case where the bottom portion of the concave portion is elongated as in a reverse semi-cylindrical shape or a groove shape, the width (length in a direction perpendicular to an elongation direction) of a so-called groove or the length in a minor axis direction when the shape of the concave portion is approximate to being elliptical may be obtained as the width w of the concave portion. In a case of a shape in which the bottom portion is elongated in two or more directions, for example, in a case where the concave ridgeline is branched, the width w may be obtained by each of branched tips. Considering a case where the shape of the concave portion is divided into a plurality of polygons, the width w when the shape of each of the polygons is approximate to being elliptical may be obtained. In a case where a concave ridgeline forming the bottom portion is not recognized or a case where the shape is a closed shape but a complex shape, considering a case where the shape of the concave portion is divided into a plurality of polygons, the width w when the shape of each of the polygons is approximate to being elliptical may be obtained.

A concave portion, a convex portion, and the width w thereof in a case where the convex-concave surface is a rough surface such as a sandblasted surface are not limited to those in the above descriptions.

From a viewpoint of the design, if the width w of the concave portion and the convex portion is increased and too large, the concave portion and the convex portion may be visually recognized. Thus, the minimum value of the width w of each of a concave portion and a convex portion is preferably equal to or smaller than 200 µm and is more preferably equal to or smaller than 100 µm. At this time, the width w of the concave portion may include the length of a shape in which the bottom portion is elongated, in the elongated direction or the length of a shape in a case where the bottom portion is approximate to being elliptical, in a major axis direction. The width w of the convex portion may include the length of a shape in which the bottom portion is elongated, in the elongated direction or the length of a shape in a case where the bottom portion is approximate to being elliptical.

The applicant found that the visual recognition state of the surface varied depending on the value of the width w. In particular, in a case of a structure having a surface on which a plurality of concave surfaces or convex surfaces was provided, as in a lens array, in a case where the average value of widths w was set to be about 60 µm, granularity was viewed on the surface of the optical member 30, but in a case where the average value of widths w thereof was set to be about 30 µm, the surface of the optical member 30 was observed as a smooth surface. The reason is considered as follows. In a case where the average value of the widths w is about 60 µm, although the concave portion is not observed in direct visual recognition, averaging is not sufficiently performed in a range resolved by eyes and in-plane color distribution occurs by angle dependency and the like of reflectance which is caused by an inclination of the concave portion. In a case where the average value of the widths w is about 30 µm, it is considered that the concave portion is sufficiently small at a resolution of the eyes, angle dependency of reflectance occurring by the inclination of the concave portion is sufficiently averaged, and thus the surface of the above structure is observed as a smooth surface. Although the above descriptions are obtained as a result in a lens array, it is considered that the above descriptions are also applied to a general convex-concave shape. Accordingly, in a case where an uniform surface is required as the visual recognition state of a surface, the average value of widths w is preferably smaller than 60 µm and more preferably equal to or smaller than 30 µm.

Here, although an organoleptic evaluation can be applied as an evaluation of granularity, the evaluation may be performed by using a capturing device such as a camera. In the latter case, as a capturing condition, the numerical aperture of a lens may coincide with an average numerical aperture of eyes of a person in the standard use environment of the optical member, and an evaluation is preferably performed at a standard visual recognition distance of the optical member. Image processing is performed on a captured image, and thus it is possible to obtain coordinates on a color space in a plane of the optical member. However, at this time, averaging processing of a pixel may be performed at a resolution with coinciding with an average resolution of the eyes of a person. A repetition frequency or a deviation from an average value in a plane of the image is evaluated, and thus granularity can be compared. As the image processing, processing such as Fourier transform may be performed. In a case where color difference is used as an evaluation criterion, the standard deviation of in-plane color difference using a value in Table 1 (which will be described later) may be equal to or smaller than 13 and is preferably equal to or smaller than 6.5. The standard deviation is preferably equal to or smaller than 3.2, more preferably equal to or smaller than 1.6, further preferably equal to or smaller than 0.8, and most preferably equal to or smaller than 0.4. Even in a case where the determination criterion from the functional evaluation is provided, a threshold may be statistically determined from organoleptic evaluation results by a plurality of persons.

Figure 10A:
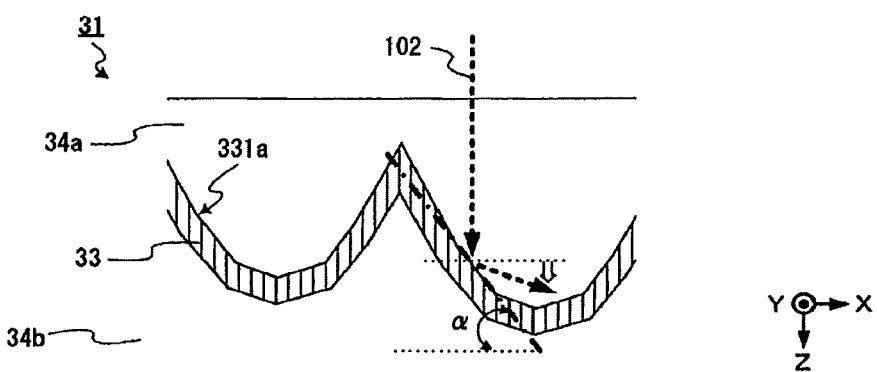
FIGS. 10A to 10C are diagrams illustrating a relationship between an angle of inclination on a convex-concave surface of a selective reflection film 33 and reflection-scattering of visible light.
Figure 10B:
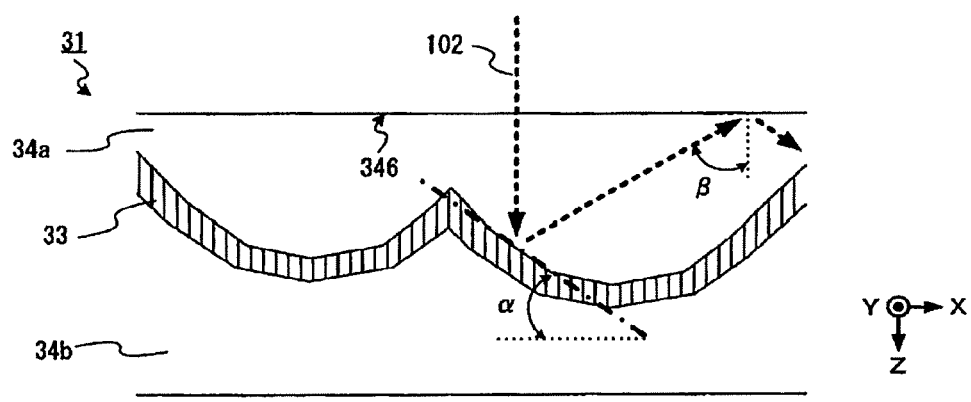
Figure 10C:
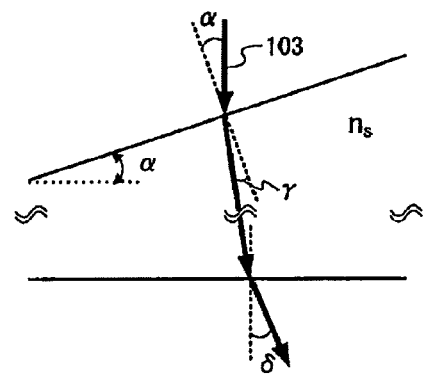

Next, an angle of inclination α of the convex-concave surface of the selective reflection film 33 functioning as the scattering unit will be described. FIGS. 10A to 10C are diagrams illustrating a relationship of an angle of inclination α of the convex-concave surface (in the example of FIGS. 10A to 10C, convex-concave surface 331a) of the selective reflection film 33 functioning as the scattering unit, and reflection-scattering of visible light. FIGS. 10A to 10C illustrate the convex-concave surface 331a as the convex-concave surface. In a case where the anti-visual recognition side is also set as the observation surface, it is assumed that the convex-concave surface 331b is similar to the convex-concave surface 331a. In this case, it should be note that a path of visible light is reversed in direction.

In particular, if the angle of inclination α of the convex-concave surface of the selective reflection film 33 is increased, reflected light which is not intended may be occur in infrared light by the angle dependency of the selective reflection film 33, and the increased angle of inclination may be the cause of reducing reflection-scattering intensity even in visible light. Here, a plane which is the reference (position of 0°) of the angle of inclination α may have a surface direction (XY plane) of a substrate. FIGS. 10A and 10B illustrate the angle of inclination α of a portion irradiated with a ray of light.

For example, as illustrated in FIG. 10A, in a case where the angle of inclination α is larger than 45°, visible light 102 reflected by the selective reflection film 33 is light in a direction which causes a traveling direction at a time of being incident to be directed forward (see a white arrow in FIG. 10A). If the proportion of light reflected forward in this manner to the entire visible light reflected by the selective reflection film 33 is large, the proportion of light reflected backward, which is a direction which causes the traveling direction at a time of being incident to be retreated, become relatively small. If the proportion of the light reflected backward is small, the light quantity of light (reflected light) brought back to an incident interface (may be also an emission interface) of the optical member 30 for the visible light may be decreased or sufficient scattering characteristics may not be obtained. In a case where reflection and scattering for visible light insufficiently occurs, there are problems, for example, that coloring of the optical member 30, that is, a color viewed from a user is shifted from predetermined hue and brightness is lowered. In addition, if the light quantity of reflected light is decreased, there are problems that the light quantity of visible light emitted from the anti-visual recognition side of the optical member 30 is increased and the quantity of stray light for infrared light is increased.

As illustrated in FIG. 10B, in a case where the angle of inclination α is larger than $0.5 \times a \sin(1/n_s)$, visible light 102 reflected by the selective reflection film 33 easily reaches the emission interface 346 of the base member being in contact with the convex-concave surface of the selective reflection film 33, at an angle β which is larger than $a \sin(1/n_s)$. Here, $n_s$ indicates the refractive index of the base member. In a case where the material of the convex-concave structure part of the base member is different from the material of a portion constituting the emission interface, the portion of the base member, which constitutes the emission interface forms an interface with air. Thus, the refractive index of the portion may be used as $n_s$.

As illustrated in FIG. 10B, if the visible light 102 reaches the emission interface 346 at the angle β which is larger than $a \sin(1/n_s)$, total reflection on the emission interface 346 occurs. Thus, if such a proportion of visible light is large, similar to the above case, the light quantity of reflected light may be decreased or sufficient scattering characteristics may not be obtained.

Accordingly, regarding the convex-concave surface of the selective reflection film 33, a region in which the angle of inclination α is within 45° is preferably equal to or greater than 90% in the effective area to which visible light is incident. A region in which the angle of inclination α is set to be within $0.5 \times a \sin(1/n_s)$ is more preferably equal to or greater than 90%. It is further preferable that the angle of inclination α is within 45° in the entire region of the effective area. It is furthermore preferable that the angle of inclination α is within $0.5 \times a \sin(1/n_s)$ in the entire region of the effective area.

Although the above-described angle of inclination α defines the angle of inclination of the convex-concave surface of the selective reflection film 33, a convex-concave shape of the convex-concave surface of the selective reflection film 33 is considered to be obtained by modeling the convex-concave shape of the convex-concave surface of the base member, which is a film formation target. Thus, the above-described definition of the angle of inclination α may be also applied to the convex-concave surface of the base member set as the film formation target. If the convex-concave surface of the base member set as the film formation target satisfies the above-described definition of the angle of inclination α, it is preferable that a lot of gentle inclination portions are provided or the selective reflection film 33 having a uniform film thickness is easily formed. At this time, in a case where the convex-concave structure forming the convex-concave surface of the base member is a configuration in which lens units having a curved surface which can be defined by a predetermined curvature radius, for example, a lens array, are arranged without a gap, conditions as follows are preferably satisfied in addition to the angle of inclination a or instead of the angle of inclination α.

That is, a case where the curvature radius of the lens unit is set as R and a distance from the center of the lens unit to the vertex of a boundary portion of the lens unit is set to be a radius r of the lens unit is considered. At this time, the ratio r/R of the curvature radius R and the radius r is preferably equal to or greater than a numerical value γ corresponding to a case where the angle of inclination α is equal to or larger than 45°. The angle of inclination α is more preferably equal to or smaller than a numerical value ζ corresponding to a case of being equal to or smaller than $0.5 \times a \sin(1/n_s)$. Here, regarding r/R, both of the numerical value γ and the numerical value ζ depend on the refractive index $n_s$. For example, in a case where the refractive index $n_s$ is 1.51, the numerical value γ is set to 0.71 and the numerical value ζ is set to 0.35. In the more general case, an inclination of the lens unit satisfies $\alpha = a\tan[(r/R)/\{1-(r/R)^2\}^{0.5}]$. If a condition of total reflection on the emission interface satisfies $n_s \sin \beta = 1$, a value is obtained by a relational expression of $2\alpha = \beta$ and an expression of $r/R = \tan\{0.5 \times a \sin(1/n_s)\}/[1+\tan^2\{0.5 \times a \sin(1/n_s)\}]^{0.5}$.

From a viewpoint of coloring capability, regarding the entirety of the optical member 30, the FWHM of a reflection scattering angle of visible light is preferably equal to or larger than 5°, more preferably equal to or larger than 15°, and further preferably equal to or larger than 30°. In a case where the FWMH of the reflection scattering angle is small, the optical member 30 may have gloss, as in a pearl. Thus, it is possible to reduce gloss by setting the FWMH to be equal to or smaller than 5°. Regarding the entirety of the optical member 30, in a specific wavelength in a target wavelength band of visible light, the ratio of the total light quantity of the reflected-scattered light to the light quantity of the incident light is preferably equal to or greater than 5%, more preferably equal to or greater than 50%, and further preferably equal to or greater than 75%. The brightness of the color of the optical member 30 can be increased by performing in this manner. As will be described later, in a case where the optical member 30 is used with matching with the housing member, reflection scattering characteristics may be adjusted to coincide with those of the housing member. In a case where the reflection scattering angle from the scattering unit is large, superposition of scattered light from an adjacent concave or convex occurs largely, and thus it is possible to expect reduction of the granularity. Thus, even in this point, the FWHM of the reflected-scattered light is preferably large.

Information of the angle of inclination α is also obtained in a manner that one base member of the first base member 34a and the second base member 34b is taken out, light is incident to the taken base member, and scattering characteristics are measured. For example, as illustrated in FIG. 10C, if inspection light 103 is incident to a base member which has a refractive index $n_s$ and has a surface on one side, which is inclined at a slope α, and a surface on the opposing side, which is inclined at 0°, the inspection light 103 is refracted in a direction of an angle γ which satisfies $\sin \alpha = n_s \sin \gamma$, by the Snell's law. A ray of refracted light is incident to the opposing surface at an angle (α−γ). Thus, if an angle of the ray of light emitted from the opposing surface is set as δ, $n_s \sin(\alpha-\gamma) = \sin \delta$ is satisfied. With the above descriptions, $\delta = a \sin [\sin \alpha \times \{(n_s^2 - \sin^2 \alpha)^{0.5} - \cos \alpha\}]$ is satisfied. Accordingly, the refractive index of the base member and the scattering characteristics of light scattered by the convex-concave surface are checked, and thus information of the angle of inclination α of the convex-concave surface is obtained.

For example, in a case where the refractive index $n_s$ of the base member for the inspection light 103 is set to 1.51, if α is set to 45°, δ is 26.3°. Thus, in a case where a ray of light scattered at an angle of 26.3° or larger is provided when light is incident to the base member, the convex-concave surface of the base member includes an inclination of 45° or larger. If α is set to satisfy $0.5 \times a \sin(1/n_s) = 20.7°$, δ is 10.9°. Thus, in a case where a ray of light scattered at an angle of 10.9° or larger is provided when light is incident to the base member, the convex-concave surface of the base member includes an inclination of $(0.5 \times a \sin(1/n_s))°$ or larger.

Figure 11:
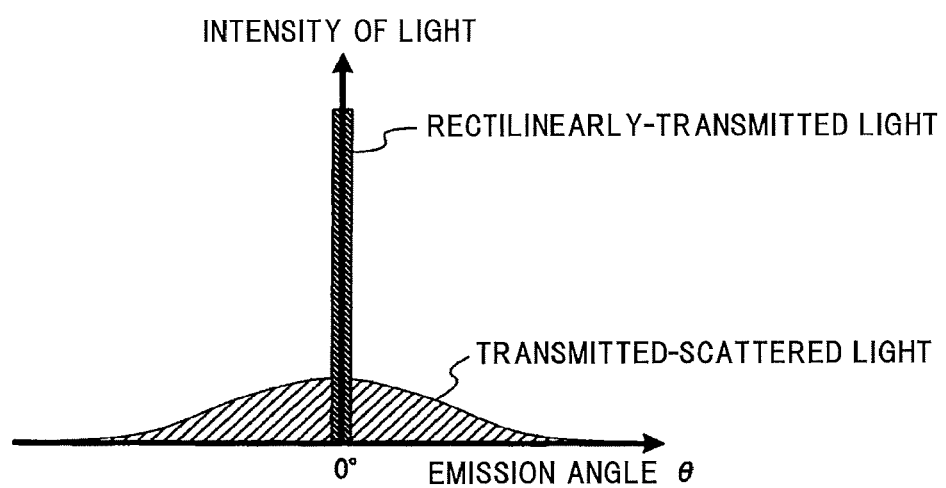
FIG. 11 is a graph illustrating an example of angle dependency in light quantity distribution of a transmission component of infrared light by a reflection-scattering unit 31.

FIG. 11 is a graph illustrating an example of the angle dependency of light quantity distribution for a transmission component by the reflection-scattering unit 31, on incidence of infrared light. In FIG. 11, a horizontal axis indicates an emission angle θ[°] of the transmission component and a vertical axis indicates light intensity. It is considered that incident infrared light travels in a Z direction. As illustrated in FIG. 11, infrared light which is transmitted through the reflection-scattering unit 31, more specifically, through the first base member 34a, the selective reflection film 33, and the second base member 34b can be roughly divided into rectilinearly-transmitted light and transmitted-scattered light. As described above, large rectilinearly-transmitted light for infrared light which is incident to the optical member 30 is obtained through the multiple action of the first base member 34a, the selective reflection film 33, and the second base member 34b.

However, at this time, modulation of the light quantity of transmitted light may be performed by the angle dependency of the selective reflection film 33 or scattering may occur by an edge portion at an interface in each convex-concave structure. Accordingly, in this example, $T_0$ may be set to be a ratio of the light quantity of rectilinearly-transmitted light to the light quantity of incident light of infrared light in the optical member 30. In this case, similar to the case of the optical member 20, $T_0$ is preferably equal to or greater than 75%, more preferably equal to or greater than 85%, further preferably equal to or greater than 90%, and most preferably equal to or greater than 95%. A point of being able to perform an evaluation even by using the haze value instead of $T_0$ is similar to the case of the optical member 20.

In this example, in a case where light other than rectilinearly-transmitted light in infrared light which is transmitted through the optical member 30 is set to be transmitted-scattered light, $T_1$ may be set to be a ratio of the total light quantity of the transmitted-scattered light to the light quantity of the incident light of infrared light in the optical member 30. In this case, $T_1'$ which satisfies $T_1/(T_0+T_1) \times 100$ [%] is preferably equal to or smaller than 10%, more preferably equal to or smaller than 5%, and further preferably equal to or smaller than 2%. In this example, $T_1'$ is not obtained by measuring all rays of transmitted light for the infrared light and may be obtained by measuring light emitted within a predetermined angle, as a target, in accordance with the specifications of a device that handles the infrared light.

Although not illustrated, the optical member 30 may include a plurality of reflection-scattering units in a thickness direction (Z direction). In this case, each of the reflection-scattering units may be adjusted such that the total quantity of reflected-scattered light is increased with traveling from a side on which visual recognition is performed to the thickness direction. For example, such a reflection-scattering unit is provided, and thus the number of scattering surfaces is increased. Accordingly, diffusion capability of reflection is improved.

Figure 12A:
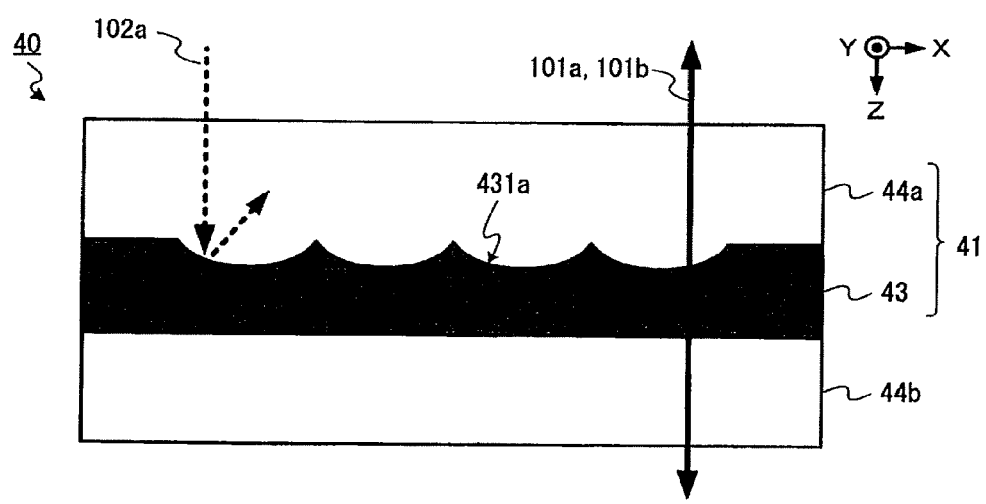
FIGS. 12A and 12B are configuration diagrams illustrating still another example of the optical member.
Figure 12B:
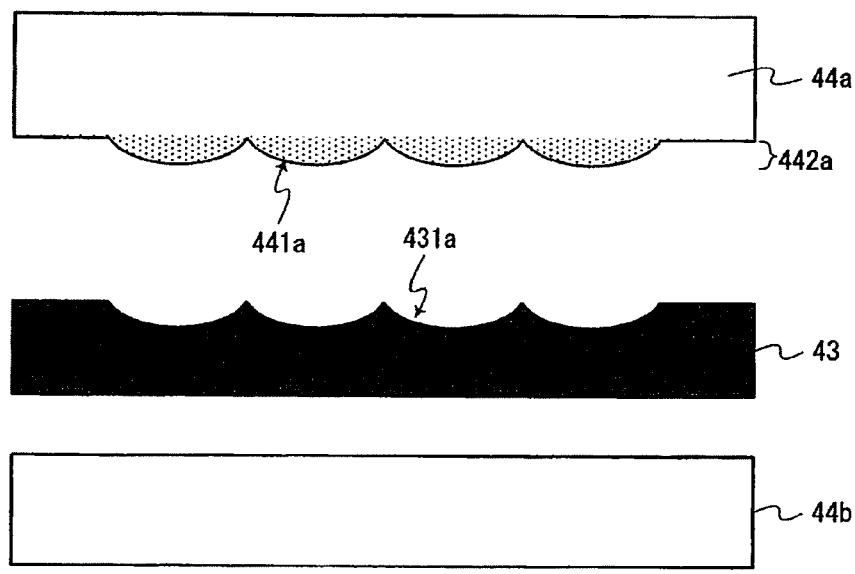

Next, another example of a case where the convex-concave surface of the reflection member is used in the scattering unit 12 will be described. FIG. 12A is a cross-sectional view illustrating another configuration example in which the optical member has the convex-concave surface of the reflection member as the scattering unit. FIG. 12B is an exploded cross-sectional view of the main components of an optical member 40 illustrated in FIG. 12A. An optical member 40 illustrated in FIGS. 12A and 12B include a reflection-scattering unit 41 and a second base member 44b. The reflection-scattering unit 41 includes a cholesteric-phase liquid crystal layer 43 and a first base member 44a.

A surface (XY plane) of the cholesteric-phase liquid crystal layer 43 on the visual recognition side in this example is set as the convex-concave surface. A surface of the first base member 44a (positioned on the visual recognition side (first side) when viewed from the cholesteric-phase liquid crystal layer 43) on a side being in contact with the cholesteric-phase liquid crystal layer 43 is also set as the convex-concave surface. In the following descriptions, a convex-concave surface of the cholesteric-phase liquid crystal layer 43 on the visual recognition side may be referred to as a convex-concave surface 431a. The convex-concave surface of the first base member 44a on the side being in contact with the cholesteric-phase liquid crystal layer 43 may be referred to as a convex-concave surface 441a.

In the example illustrated in FIG. 12A, the cholesteric-phase liquid crystal layer 43 is provided as the reflection member of the selective reflection unit. The convex-concave surface 431a of the cholesteric-phase liquid crystal layer 43 on the visual recognition side corresponds to the convex-concave surface acting as the scattering unit. Such a convex-concave surface 431a of the cholesteric-phase liquid crystal layer 43 may be formed, for example, in a manner that a convex-concave structure is formed on a surface of a base member (first base member 44a) on a side being in contact with the convex-concave surface 431a, the surface on which the convex-concave structure is formed is set as a convex-concave surface, and the cholesteric-phase liquid crystal layer 43 is interposed between the convex-concave surface as an inner side and one base member (second base member 44b). At this time, a shape in which a convex-concave surface (convex-concave surface 441a) on an inner side of the base member (first base member 44a), which is in contact with the convex-concave surface 431a, and the convex-concave surface 431a are fit with each other is made.

Figure 13A:
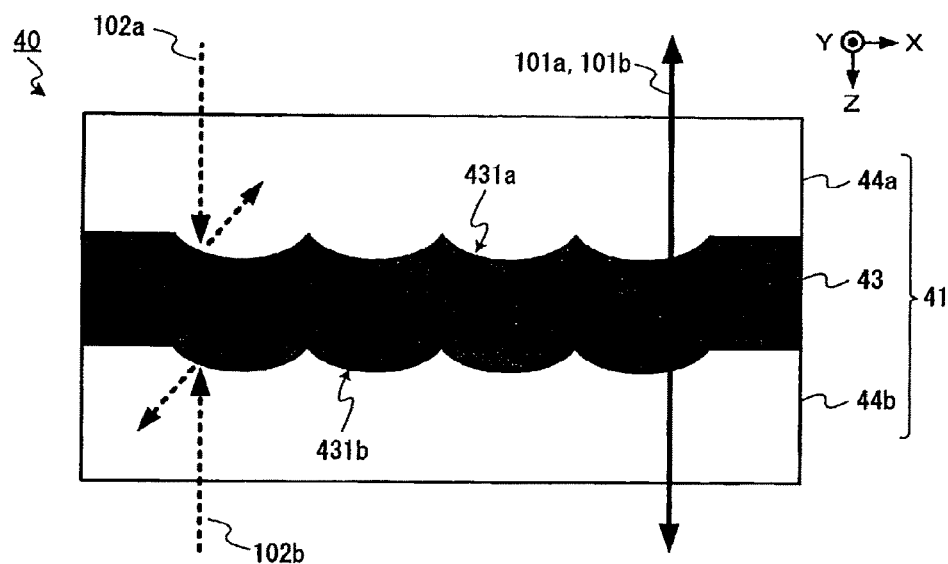
FIGS. 13A and 13B are configuration diagrams illustrating still another example of the optical member.
Figure 13B:
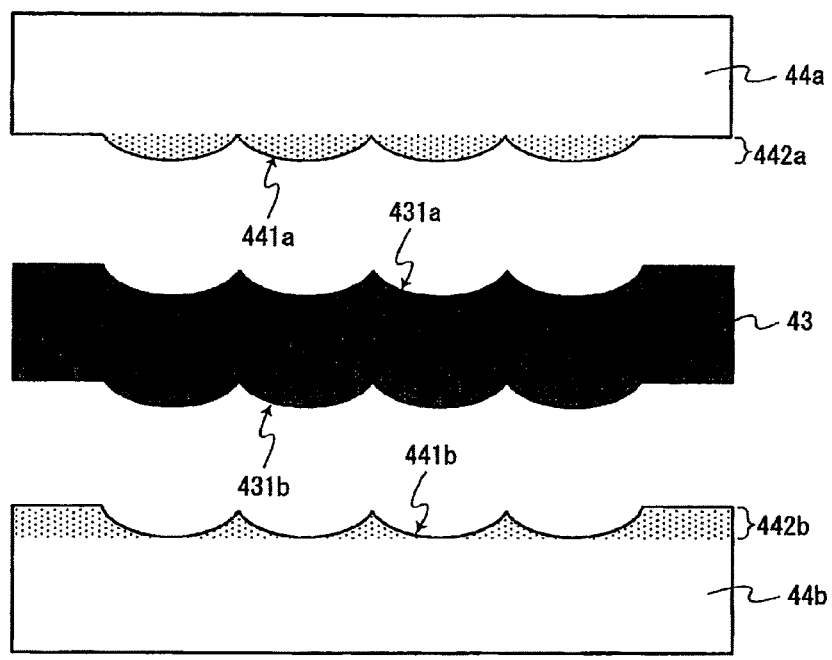

As illustrated in FIGS. 13A and 13B, the cholesteric-phase liquid crystal layer 43 corresponding to the reflection member in this example may have convex-concave surfaces on the visual recognition side and the anti-visual recognition side. In such a case, the convex-concave surface (convex-concave surface 431b) of the cholesteric-phase liquid crystal layer 43 on the anti-visual recognition side corresponds to the convex-concave surface acting as the scattering unit. In the following descriptions, in a configuration in which convex-concave surfaces are provided on both of the visual recognition side and the anti-visual recognition side of the cholesteric-phase liquid crystal layer 43, the convex-concave surface of the cholesteric-phase liquid crystal layer 43 on the anti-visual recognition side may be referred to as the convex-concave surface 431b. The convex-concave surface of the second base member 44b being in contact with the convex-concave surface 431b, on a side being in contact with the convex-concave surface 431b may be referred to as the convex-concave surface 441b. Such a convex-concave surface 431b of the cholesteric-phase liquid crystal layer 43 may be formed, for example, in a manner that a convex-concave structure is formed on a surface of a base member (second base member 44b) on a side being in contact with the convex-concave surface 431b, the surface on which the convex-concave structure is formed is set as a convex-concave surface, and the cholesteric-phase liquid crystal layer 43 is interposed between the convex-concave surface as an inner side and one base member (first base member 44a). At this time, a shape in which a convex-concave surface 441b on an inner side of the base member (second base member 44b), which is in contact with the convex-concave surface 431b, and the convex-concave surface 431b are fit with each other is made.

The first base member 44a may have transmissive characteristics for visible light and infrared light. The second base member 44b may have transmissive characteristics for at least infrared light, similar to the base member 14. In a case where the anti-visual recognition side of the optical member 40 is also set as the observation surface, the second base member 44b may have transmissive characteristics for visible light and infrared light.

In addition, the cholesteric-phase liquid crystal layer 43 and the first base member 44a which is a member being in contact with the convex-concave surface of the cholesteric-phase liquid crystal layer 43 in this example may have refractive indices which are substantially the same as each other in a target wavelength band of at least the infrared region. In a case where both surfaces of the cholesteric-phase liquid crystal layer 43 are convex-concave surfaces, similar to a case of the optical member 30, instead of the cholesteric-phase liquid crystal layer 43, the first base member 44a and the second base member 44b which is one member being in contact with the convex-concave surface of the cholesteric-phase liquid crystal layer 43 may have refractive indices which are substantially the same as each other in a target wavelength band of at least the infrared region. The refractive index of the cholesteric-phase liquid crystal layer 43 may be an average refractive index which will be described later.

The cholesteric-phase liquid crystal layer 43 is configured to reflect visible light of a predetermined proportion or greater and to transmit infrared light of a predetermined proportion or greater. The cholesteric-phase liquid crystal has a selective reflection band by a helical structure of liquid crystal molecules and the selective reflection band is provided in the visible wavelength range, and thus it is possible to selectively reflect only visible light.

More specifically, in the cholesteric-phase liquid crystal layer 43, a helical pitch p or an average refractive index $n_c$ of liquid crystal may be adjusted. Generally, a selective reflection wavelength $\lambda_R$ of cholesteric-phase liquid crystal is obtained by Expression (1).

$$\lambda_R = p \cdot n_c \qquad (1)$$

Thus, the helical pitch p or the average refractive index $n_c$ of liquid crystal may be adjusted such that the selective reflection wavelength $\lambda_R$ is substantially the same as the wavelength of visible light, which is desired to be selectively reflected, in Expression (1). As a method of adjusting the helical pitch p, a method of adjusting helical twisting power (HTP) or concentration of a chiral agent is exemplified in addition to aligned control.

Although FIG. 12A, 12B, 13A or 13B illustrates an example of including one cholesteric-phase liquid crystal layer 43, the cholesteric-phase liquid crystal layer 43 is not limited to a single layer. For example, the optical member 40 may include a plurality of cholesteric-phase liquid crystal layers 43 which have different selective reflection bands (in a manner of being layered in the thickness direction (Z direction)), as the reflection-scattering unit 41. At this time, a plurality of cholesteric-phase liquid crystal films or the like which includes the first base member 44a or the second base member 44b may be layered. As an example, three kinds of cholesteric-phase liquid crystal layers or cholesteric-phase liquid crystal films in which the center of the selective reflection band is set to 430 nm, 530 nm, and 630 nm may be layered. With such a configuration, infrared light can be transmitted while visible light in a wide band is reflected and scattered.

Figure 14:
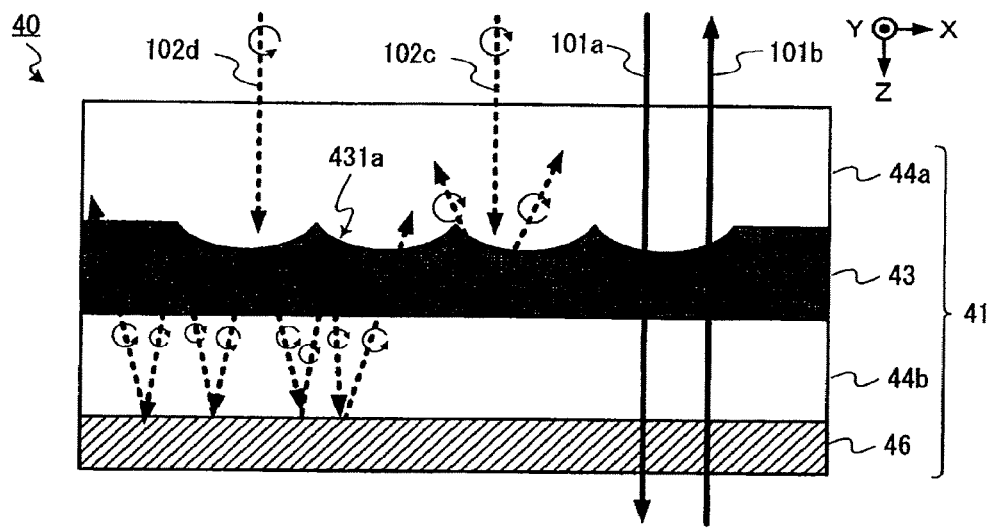
FIG. 14 is a configuration diagram illustrating still another example of the optical member.

The cholesteric-phase liquid crystal has features of reflecting circularly polarized light which corresponds to a helical aligned. Thus, as illustrated in FIG. 14, a second selective reflection unit 46 may be provided on the anti-visual recognition side of the cholesteric-phase liquid crystal layer 43. With such a configuration, light of both kinds of circularly polarized light can be reflected and scattered.

The second selective reflection unit 46 may be configured to reflect visible light having a wavelength band which includes the selective reflection band of the cholesteric-phase liquid crystal layer 43, of which the quantity is equal to or greater than a predetermined proportion, and to transmit infrared light whose quantity is equal to or greater than a predetermined proportion. The second selective reflection unit 46 may be, for example, a dielectric multilayer film used in a mirror layer of a dichroic mirror. The second selective reflection unit 46 is not limited to be provided on the anti-visual recognition side of the second base member 44b which interposes the cholesteric-phase liquid crystal layer 43. However, for example, the second selective reflection unit 46 may be provided between the second base member 44b and the cholesteric-phase liquid crystal layer 43. In a case of including a plurality of cholesteric-phase liquid crystal layers 43, the second selective reflection unit 46 corresponding to the cholesteric-phase liquid crystal layer 43 may be provided for each of the cholesteric-phase liquid crystal layers 43. The second selective reflection unit 46 may be provided on the anti-visual recognition side of the cholesteric-phase liquid crystal layer 43 which is on the most anti-visual recognition side. The second selective reflection unit 46 reflects visible light having a wavelength band which includes a selective reflection band of all of the plurality of cholesteric-phase liquid crystal layers 43, and transmits infrared light.

For example, in a case where cholesteric-phase liquid crystal showing selective reflection for visible light 102c of right-handed circularly polarized light is used as the cholesteric-phase liquid crystal layer 43, visible light 102d of left-handed circularly polarized light which is transmitted is reflected by the second selective reflection unit 46. At this time, a phase difference TC imparted in the second selective reflection unit 46 causes the visible light 102d to act as a ray of the right-handed circularly polarized light and to be incident to the cholesteric-phase liquid crystal layer 43 again. The visible light 102d of the right-handed circularly polarized light which has been incident to the cholesteric-phase liquid crystal layer 43 again is reflected by the helical structure of the cholesteric-phase liquid crystal layer 43, and is incident to the second selective reflection unit 46 again. Thus, the visible light 102d of the right-handed circularly polarized light which is incident to the second selective reflection unit 46 again finally serves as scattered light of the left-handed circularly polarized light, and is emitted from the emission interface on the visual recognition side. The visible light 102c of the right-handed circularly polarized light is reflected and scattered by the multiple action of reflection or refraction occurring by the convex-concave surface 431a at the incident interface of the cholesteric-phase liquid crystal layer 43 and selective reflection occurring by the helical structure in the cholesteric-phase liquid crystal layer 43. As described above, the optical member 40 includes the second selective reflection unit 46, and thus reflection scattering characteristics for visible light of right-handed and left-handed circularly polarized light are obtained.

The infrared light 101a and 101b are transmitted through the cholesteric-phase liquid crystal layer 43. In this example, a configuration in which an optical path length when infrared light is transmitted through the first base member 44a, the cholesteric-phase liquid crystal layer 43, and the second base member 44b is not changed in accordance with an incidence position or is changed slightly is made. Thus, the infrared light 101a and the infrared light 101b are not refracted but emitted from the optical member 40. As described above, with this configuration, it is also possible to obtain the sufficient occurrence of reflection and scattering for visible light and to largely reduce the occurrence of scattering for infrared light.

The convex-concave surface 441a of the first base member 44a and the convex-concave surface 441b of the second base member 44b in this example are more preferable because of favorable aligned properties of liquid crystal if the surfaces 441a and 441b have a shape in which a lot of smooth curved surfaces (including freely-curved surface, aspherical surface, and spherical surface) are provided.

Other points are the same as those in this example, that is, may be similar to the optical member 30 which is one example of having the convex-concave surface formed on the reflection member, as the scattering unit.

Figure 15:
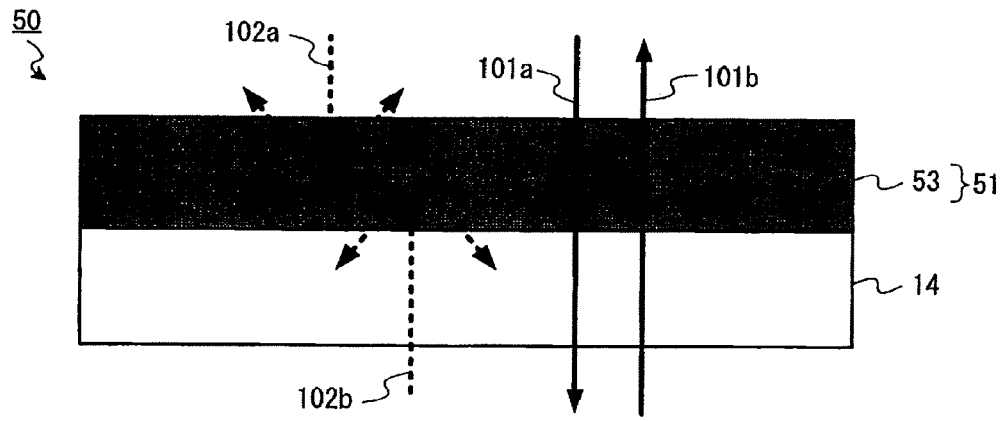
FIG. 15 is a configuration diagram illustrating still another example of the optical member.

Next, an example of a case where cholesteric-phase liquid crystal is used in the reflection-scattering unit 11 will be described. FIG. 15 is a configuration diagram illustrating an example in which the optical member includes a cholesteric-phase liquid crystal layer as the reflection-scattering unit. An optical member 50 illustrated in FIG. 15 includes a reflection-scattering unit 51 and a base member 14. The reflection-scattering unit 51 includes a cholesteric-phase liquid crystal layer 53.

The cholesteric-phase liquid crystal layer 53 is configured to reflect and scatter visible light of a predetermined proportion or greater and to transmit infrared light of a predetermined proportion or greater. For example, the cholesteric-phase liquid crystal layer 53 may be a cholesteric-phase liquid crystal layer in which a plurality of regions having different aligned axes is provided in a plane of this layer. Such a cholesteric-phase liquid crystal layer 53 may be formed in a manner that a selective reflection band is set in the visible wavelength range and aligned treatment of liquid crystal is not performed when the cholesteric-phase liquid crystal layer is formed. It is possible to cause reflection and scattering in the selective reflection band which has been set, by such disorder of the alignment.

As illustrated in FIG. 15, the optical member 50 in this example causes visible light 102a and 102b to be reflected and scattered and causes infrared light 101a and 101b to be transmitted, by the cholesteric-phase liquid crystal layer showing reflection and scattering.

In this example, the optical member 50, more specifically, the reflection-scattering unit 51 may also include a plurality of cholesteric-phase liquid crystal layers. In this example, as illustrated in FIG. 15, in the optical member 50, the second selective reflection unit 46 may be provided on the anti-visual recognition side of the cholesteric-phase liquid crystal layer 53. In a case where a plurality of cholesteric-phase liquid crystal layers 53 is provided, the second selective reflection unit 46 may be provided on the anti-visual recognition side of each of the cholesteric-phase liquid crystal layers 53 or on the anti-visual recognition side of the cholesteric-phase liquid crystal layer 53 which is positioned on the most anti-visual recognition side. With such a configuration, light of both kinds of circularly polarized light can be reflected and scattered.

Figure 16:
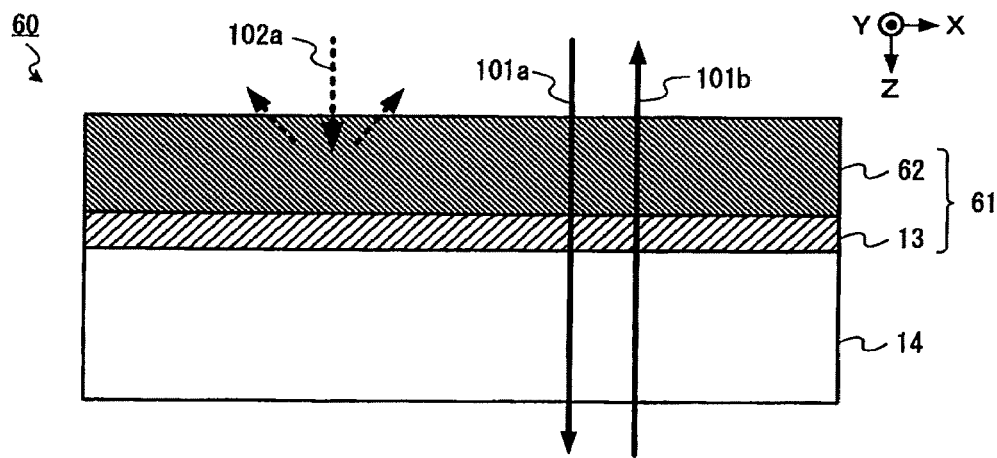
FIG. 16 is a configuration diagram illustrating still another example of the optical member.

Next, an example of a case where fine particle-containing resin is used in the scattering unit 12 will be described. FIG. 16 is a cross-sectional view illustrating an example in which an optical member includes a fine particle-containing resin layer as the scattering unit. An optical member 60 illustrated in FIG. 16 includes a base member 14 and a reflection-scattering unit 61. The reflection-scattering unit 61 includes a fine particle-containing resin layer 62 as the scattering unit and the selective reflection unit 13.

The fine particle-containing resin layer 62 may be formed by using a resin material having light transmissive properties for visible light and infrared light, as a binder, in a manner that fine particles having a refractive index which is different from that of the resin in at least the visible wavelength range are uniformly dispersed in the resin material.

At this time, as described above, a particle diameter of the fine particles or the ratio of the refractive index between the fine particles and the resin material as the binder is adjusted, and thus it is possible to increase the occurrence of scattering for visible light and reduce the occurrence of scattering for infrared light. For example, a material containing a dye or a pigment having an absorption band in the vicinity of the infrared region is added to the resin, and thus it is possible to cause a large difference of the refractive index between a target wavelength band of the visible wavelength range and a target wavelength band of the infrared region. Adjustment may be performed such that the difference of the refractive index in the target wavelength band of the infrared region between the resin and the fine particles is reduced or refractive indices thereof are substantially the same as each other.

As described above, according to this embodiment, it is possible to provide an optical member including the reflection-scattering unit in which the reflection-scattering characteristics for visible light are high and the rectilinear transmissive characteristics for infrared light are high.

In each of the above-described optical members, either of an absorption member that absorbs visible light and transmits infrared light or a reflection member that reflects visible light and transmits infrared light may be provided on the anti-visual recognition side of the reflection-scattering unit or the base member which supports the reflection-scattering unit.

Figure 17A:
FIGS. 17A and 17B are configuration diagrams illustrating still another example of the optical member.
Figure 17B:

FIG. 17A is a configuration diagram illustrating an example in which an optical member includes the absorption member. FIG. 17B is a configuration diagram illustrating an example in which an optical member includes the reflection member.

In the example illustrated in FIG. 17A, an optical member 70 includes a reflection-scattering unit 71 and an absorption member 72. The absorption member 72 absorbs visible light and transmits infrared light.

In the example illustrated in FIG. 17B, the optical member 70 includes the reflection-scattering unit 71 and a reflection member 73. The reflection member 73 reflects visible light and transmits infrared light.

The reflection-scattering unit 71 may be, for example, any of the above-described reflection-scattering units.

According to such a configuration, it is possible to further reduce the quantity of transmitted visible light. The absorption member 72 may be realized by the base member (for example, base member 14, second base member 34b, second base member 44b, or the like) included in the optical member. That is, the absorption member 72 may be configured by the base member including an absorbent and the like.

Embodiment 2

Figure 18:
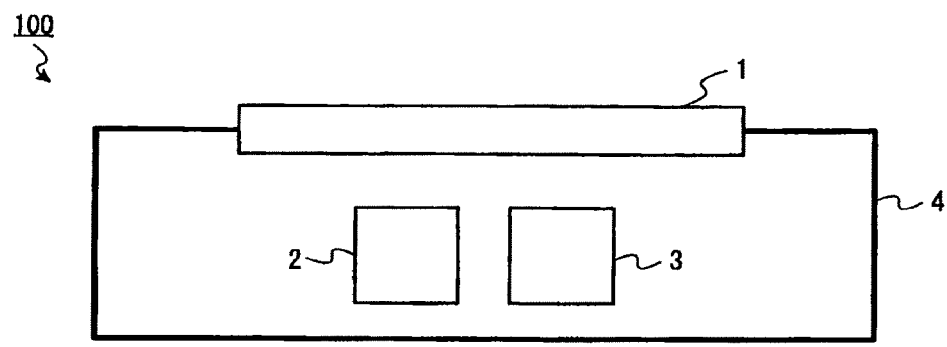
FIG. 18 is a configuration diagram illustrating an example of an optical device according to a second embodiment.

Next, a second embodiment of the present invention will be described with reference to the drawings. FIG. 18 is a configuration diagram illustrating an example of an optical device according to the second embodiment of the present invention.

An optical device 100 illustrated in FIG. 18 includes an infrared-light emitting unit 2 and/or an infrared-light receiving unit 3 in a housing 4. In the optical device 100, an optical member 1 is provided to cover an opening portion provided in the housing 4. With such a configuration, infrared light is received and emitted from and to the outside of the housing 4 through the optical member 1.

The optical device 100 is an optical device using infrared light. Examples of the optical device using infrared light include a camera device that captures an image by using infrared light, a measurement device such as a distance sensor and a proximity sensor, that detects a distance of an object or whether or not an object exists to be close by using infrared light, a communication device that perform information communication and the like by using infrared light, or an authentication device that perform biometric authentication and the like such as authentication of an iris, a fingerprint, and a vein by using infrared light.

The housing 4 may surround a device that exhibits other functions, other than the infrared-light emitting unit 2 or the infrared-light receiving unit 3.

The infrared-light emitting unit 2 is not limited to a lamp and may use a LED or a laser light source. The infrared-light emitting unit 2 is not limited to having a function of emitting infrared light, and may be a transmission unit that outputs infrared light emitted from another unit.

The infrared-light receiving unit 3 is not limited to a single light receiving element such as a photodiode, and may acquire image information as in a CMOS sensor or the like.

The optical member 1 is an infrared-light transmission filter having a function of transmitting infrared light, and reflecting and scattering visible light. The optical member 1 is viewed to be colored when viewed from the outside of the housing 4. The optical member 1 may be any of the optical members 10 to 70 described in the first embodiment, for example.

In a case where the optical member 1 is visually recognized along with a portion of the housing 4, it is difficult to visually recognize a boundary between a housing member arranged around the optical member 1 and the optical member 1, thereby it can be difficult to cause an observer to visually recognize the existence of the optical member 1. In order to degrade visibility of the optical member 1, it is preferable that the angle dependency of reflected-scattered light for visible light is caused to match with each other or the total light quantity of the reflected-scattered light is caused to match with each other, between the housing member around the optical member 1 and the optical member 1.

The angle dependency of the reflected-scattered light can be standardized by intensity of the reflected-scattered light at any angle of 5° to 15°, and can be evaluated by comparing the angle dependency of reflectance at an angle from the above angle to the maximum angle φ. In a case where the incident angle is 0°, the optical path of the incident light in light is the same as that of the reflected light, and thus it is difficult to measure the reflectance. Accordingly, a constant angle except for 0° is required. In this case, although the angle dependency of an average value of reflected-scattered light in the visible wavelength range can be evaluated, for example, it is also possible to evaluate the angle dependency of the reflected-scattered light in a specific wavelength band, by using a color filter. The maximum angle φ which allows comparison evaluation to be performed is preferably 30°, more preferably 45°, and further preferably 60°. Here, if the intensity of the reflected-scattered light on the optical member 1 at an angle ψ is set as $I_f(ψ)$ and the intensity of the reflected-scattered light on the housing member at the angle ψ is set as $I_b(ψ)$, the absolute value of a value of $(I_f(ψ)-I_b(ψ))/I_b(ψ)$ is preferably equal to or smaller than 0.2, more preferably equal to or smaller than 0.1, and further preferably equal to or smaller than 0.05.

Such comparison of the color can be also evaluated, for example, by using a CIE1976 (L*, a*, b*) color space. In this color space, L* indicates brightness and an index of being bright. a* and b* indicate an index of chromaticity. That is, an a* direction indicates a red color direction. A-a* direction indicates a green color direction. Ab* direction indicates a yellow color direction, and a-b* indicates a blue color direction. Chroma $C^*=(a^{*2}+b^{*2})^{0.5}$ is satisfied. The above values can be calculated based on a CIE XYZ color system (JIS Z8701). A calculation expression is as described in JIS Z 8781. The CIE XYZ color system is obtained in a manner that a product of a color matching function with the reflectance of a solid angle of the optical member 1 by a spectrum of a light source is integrated with a wavelength. If the reflectance at a predetermined angle is obtained and the spectrum of the light source is supposed, values of X, Y, and Z are determined and L*, a*, and b* are obtained by the determined values. In the following descriptions, each of the values is obtained by using D65 as long as particular statement for a standard light source is not provided.

In a case where, in a L*a*b* color system of two materials for the optical member 1 and the housing member, a difference of L* is set as $\Delta L^*$, a difference of a* is set as $\Delta a^*$, and a difference of b* is set as $\Delta b^*$, the values are obtained by an expression of color difference $\Delta E = (\Delta L^{*2} + \Delta a^{*2} + \Delta b^{*2})^{0.5}$. An index in Table 1 is industrially used in many cases. In the following descriptions, $\Delta E2$ is defined to satisfy $(\Delta a^{*2} + \Delta b^{*2})^{0.5}$. $\Delta E2$ includes only information of chromaticity. Thus, in a case where the brightness does not matter or in a case where an illumination state varies depending on a difference of arrangement of the optical member 1 and the housing member, $\Delta E2$ may be used as the index.

TABLE 1

| Color difference ($\Delta E$) | Degree of color difference |
| --- | --- |
| To 0.4 | A person who is sufficiently trained can perform recognition with reproducibility by color measuring device which is sufficiently adjusted |
| 0.4 to 0.8 | Limitation which can set strict color difference standard when viewed from reproducibility of visual determination |
| 0.8 to 1.6 | Level at which adjacent comparison color difference is slightly felt |
| 1.6 to 3.2 | Color difference level which is hardly felt in discrete comparison |
| 3.2 to 6.5 | Range handled as the same color at an impression level |
| 6.5 to 13 | Corresponding to color difference between Munsell color chips |
| 13 to | Color difference of an extent of distinguishment in system color |

As described above, in a case where the optical member 1 arranged to be adjacent to the housing member and be surrounded by the housing member is not visually recognized, $\Delta E2$ may be equal to or smaller than 6.5, preferably equal to or smaller than 3.2, more preferably equal or smaller than 1.6, further preferably equal to or smaller than 0.8, and most preferably equal to or smaller than 0.4. The values are strictly obtained by using $\Delta E$ instead of $\Delta E2$. In a case where the optical member 1 arranged to be adjacent to the housing member and be surrounded by the housing member is not visually recognized, $\Delta E$ may be equal to or smaller than 6.5, preferably equal to or smaller than 3.2, more preferably equal or smaller than 1.6, further preferably equal to or smaller than 0.8, and most preferably equal to or smaller than 0.4. Although using the same light source for each member is assumed in the above discussion, in a case where illumination methods for the housing member and the optical member 1 are different from each other, $\Delta E$ or $\Delta E2$ may be obtained considering this case. $\Delta E$ and $\Delta E2$ can be evaluated in a form of an average value in an area which is sufficiently larger than the resolution of the eyes. At this point, $\Delta E$ or $\Delta E2$ is different from deviation of color difference observed by granularity or the like. In a case where evaluation can be performed in an area which is substantially equal to the resolution of the eyes, the range of the standard deviation of $\Delta E$ and $\Delta E2$ for the housing member may be equal to or smaller than 13.

According to such a configuration, an optical device which does not degrade transmission sensitivity and/or reception sensitivity of infrared light and in which the opening portion of the housing is viewed to be colored by a color other than the black color is obtained.

EXAMPLES

Example 1

This example is one example of the optical member 20 using a diffractive structure, as illustrated in FIG. 2. Firstly, a multilayer film which was formed from $SiO_2$ and $Ta_2O5$ and had a configuration shown in Table 2 was formed on a glass substrate which had a refractive index of 1.51 at a wavelength of 950 nm and had a thickness of 1 mm. A $SiO_2$ layer as the top layer is formed as a layer which functions as a diffractive optical element which will be described later.

TABLE 2

| Layer no. | Thickness [nm] | Material |
| --- | --- | --- |
| 1 | 300 | $SiO_2$ |
| 2 | 57 | $Ta_2O_5$ |
| 3 | 123 | $SiO_2$ |
| 4 | 79 | $Ta_2O_5$ |
| 5 | 134 | $SiO_2$ |
| 6 | 86 | $Ta_2O_5$ |
| 7 | 107 | $SiO_2$ |
| 8 | 74 | $Ta_2O_5$ |
| 9 | 106 | $SiO_2$ |
| 10 | 66 | $Ta_2O_5$ |
| 11 | 95 | $SiO_2$ |
| 12 | 63 | $Ta_2O_5$ |
| 13 | 98 | $SiO_2$ |
| 14 | 62 | $Ta_2O_5$ |
| 15 | 83 | $SiO_2$ |
| 16 | 54 | $Ta_2O_5$ |
| 17 | 87 | $SiO_2$ |
| 18 | 56 | $Ta_2O_5$ |
| 19 | 70 | $SiO_2$ |
| 20 | 38 | $Ta_2O_5$ |
| 21 | 74 | $SiO_2$ |
| 22 | 47 | $Ta_2O_5$ |
| 23 | 68 | $SiO_2$ |
| 24 | 53 | $Ta_2O_5$ |
| 25 | 72 | $SiO_2$ |
| 26 | 45 | $Ta_2O_5$ |
| Base member | | |

Figure 19:
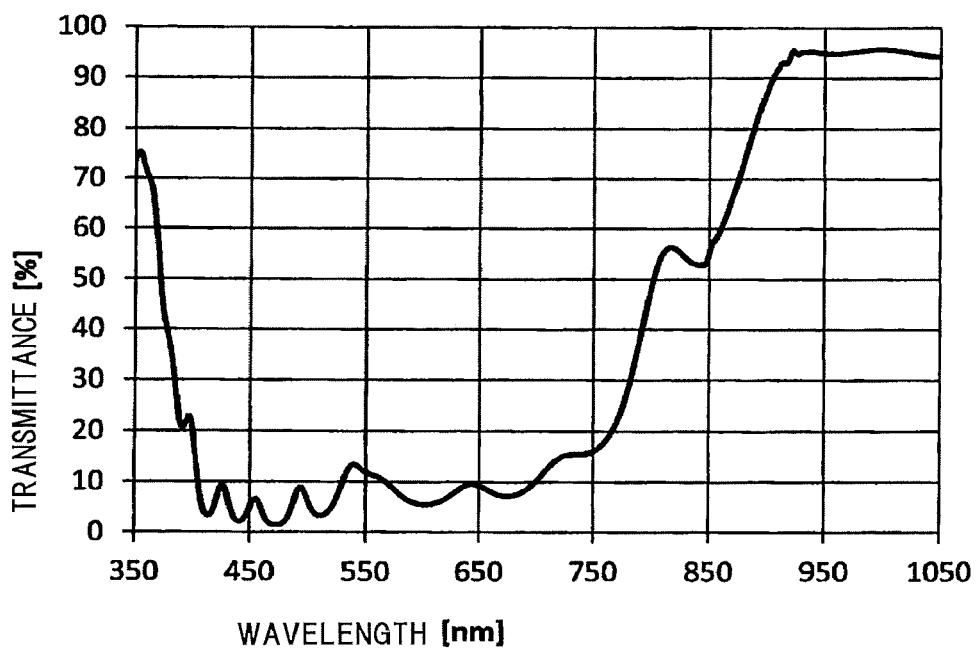
FIG. 19 is a graph illustrating transmittance characteristics of a multilayer film as the selective reflection unit.

FIG. 19 is a graph illustrating transmittance characteristics of the multilayer film in this example. As illustrated in FIG. 19, the multilayer film in this example exhibits characteristics in which transmittance for light in the visible wavelength range is low and transmittance for light having a wavelength of 900 nm or greater is high.

Then, a diffractive optical element was formed on a first layer as the top layer of the formed multilayer film. The diffractive optical element caused light at wavelength of 915 nm to be diffused in a range of ±74° in one direction and ±49° in a direction which was perpendicular to the one direction.

That is, the diffractive optical element is formed to have a two-step convex-concave shape and have a depth of 300 nm. In this manner, it is possible to manufacture the optical member 20 in which the diffractive optical element which has a depth of 300 nm and is formed from $SiO_2$ is provided on the multilayer film. The refractive index of $SiO_2$ in the infrared region (for example, wavelength of 950 nm) is about 1.45.

Figure 20:
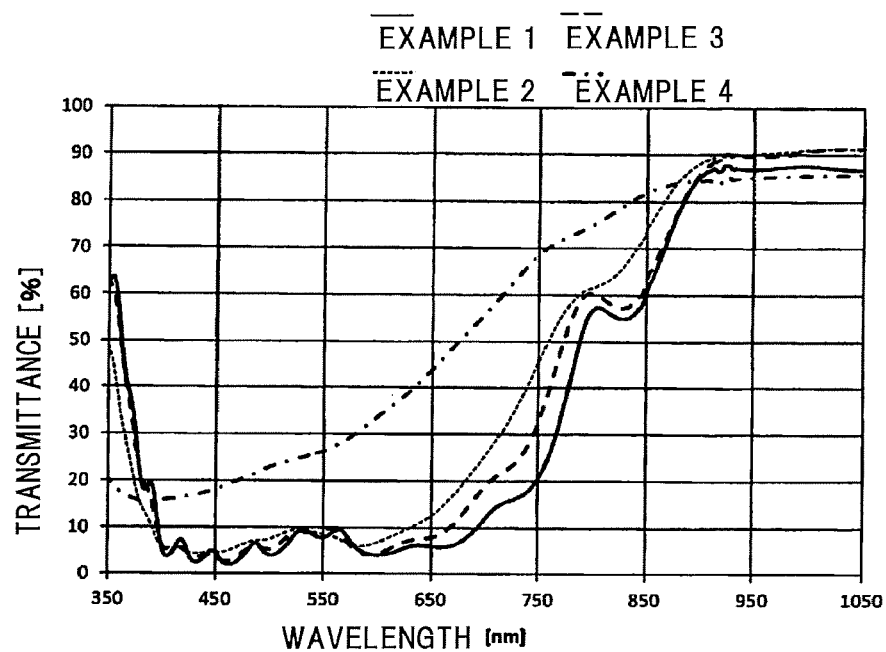
FIG. 20 is a graph illustrating measurement results of the quantity of transmitted light through optical members in first to fourth examples.

FIG. 20 illustrates measurement results of the quantity of transmitted light through the optical member 20 in this example, which are obtained by a spectrometer. As illustrated in FIG. 20, the light quantity (transmittance) of transmitted light at a wavelength of 950 nm through the optical member 20 in this example was 86.9%. The measurement results illustrated in FIG. 20 are measurement results obtained by a configuration in which antireflection processing is not performed on a surface of the glass substrate, which opposes a surface thereof on which the multilayer film is provided. Thus, if it is considered that the light quantity of reflected light on the above surface is generally 4.2%, in a case where an antireflection structure is formed on the surface of the glass substrate, which opposes the surface thereof on which the multilayer film is provided, the maximum light quantity of transmitted light at a wavelength of 950 nm through the optical member 20 in this example may be 91.1%. The light quantity of scattered light which does not reach the spectrometer is calculated to be equal to or smaller than 8.9%.

The proportion of transmitted-scattered light to the transmitted light at 938 nm through the optical member 20 in this example was measured by using a laser diode having a wavelength of 938 nm. A measuring method is as follows. Firstly, the manufactured optical member was irradiated with collimate light having a wavelength of 938 nm and the light quantity $T_t$ of transmitted light was measured by a photodiode arranged at a position of 3 cm separated from the optical member. At this time, an opening of the photodiode has a diameter of 8 mm and diffused light at an angle of 0° to 7.6° is incident to the photodiode. Then, the light quantity $T_p$ of the transmitted light was measured by a photodiode arranged at a position of 150 cm separated from the optical member. At this time, diffused light at an angle of 0° to 1.5° is incident to the photodiode. $(T_t-T_p)/T_t \times 100[\%]$ as the proportion of the transmitted-scattered light was obtained based on the above measurements, and this was 0.53%. 8.9% which is the maximum light quantity of scattered light, which is obtained from the measurement result by the spectrometer illustrated in FIG. 20 is a value greater than the obtained proportion. This is because this measurement is performed in a manner that diffused light at an angle up to 6° is measured as the transmitted light. That is, a diffusion angle of the diffractive optical element is large, and thus the light quantity density of scattered light, which is detected by the photodiode is relatively small. With the above results, it can be considered that the rectilinear transmittance for light having a wavelength of 938 nm is equal to or greater than 75%.

Then, a halogen lamp light source was observed through the optical member in this example, in a dark room by using a camera which was able to detect infrared light. As a result, hazing was slightly viewed from an image, but the halogen lamp light source was possible to be visually recognized from the image.

If the optical member in this example was visually recognized from the first side which was the side of the base member, on which the diffractive optical element was formed, the optical member was observed to be white.

In the above-described manner, the optical member in which an incident ray of light was reflected and scattered in the visible wavelength range and the incident ray of light was transmitted in the infrared region of 900 nm or greater was obtained.

Example 2

This example is one example of the optical member 30 using a convex-concave surface, as illustrated in FIGS. 8A and 8B. Firstly, a multilayer film having a configuration shown in Table 2 was formed on a glass substrate which had a refractive index of 1.51 at a wavelength of 950 nm and had a thickness of 0.7 mm and which had a convex-concave surface, similarly to Example 1.

The convex-concave surface on the substrate is a surface on which multiple concave lens units 343 which are irregularly arranged as illustrated in FIGS. 9A and 9B and have a spherical shape. Each of the lens units 343 is positioned in a honeycomb arrangement which is set as a reference and has a pitch of 60 μm, so as to position a vertex position in a range of the radius corresponding to 25% of the pitch. Such a convex-concave surface was formed in a manner that one surface of the glass substrate was subjected to wet etching by using a Mo mask which had an initial opening of a diameter of 3 μm at a position corresponding to the vertex position of each of the lens units 343. An average curvature radius of the lens units 343 on the convex-concave surface was calculated to 100 μm. An average angle of inclination at a boundary portion between the adjacent lens units 343, that is, at an end portion of each of the lens units 343 was calculated to 18°. The angle is a value smaller than 0.5×sin(1/1.51). In the convex-concave surface of the base member in this example, a region in which the angle of inclination is within 0.5×a sin(1/1.51) is equal to or greater than at least 97% of an effective area to which visible light is incident. An average of r/R of the lens units 343 is 0.32. The plan view of the element was observed as a structure having a ridgeline which was similar to that in FIGS. 9A and 9B. The width w of all concave portions in the effective area to which visible light is incident was equal to or greater than 5 μm. An average width of the concave portions is about 60 μm.

Then, the convex-concave surface on which the multilayer film had been formed was filled with resin having a refractive index of 1.51 at a wavelength of 950 nm and was flattened. Then, the resin was sealed by the opposing glass substrate. In this manner, the optical member 30 in this example was manufactured.

FIG. 20 illustrates measurement results of the quantity of transmitted light through the optical member 30 in this example, which are obtained by a spectrometer. As illustrated in FIG. 20, the light quantity of transmitted light at a wavelength of 950 nm through the optical member 30 in this example was 90.2%. The measurement results illustrated in FIG. 20 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 98.5%. The light quantity of scattered light which does not reach the spectrometer is calculated to be equal to or smaller than 1.5%.

The proportion of transmitted-scattered light to the transmitted light at 938 nm through the optical member 30 in this example was measured by using a laser diode having a wavelength of 938 nm. A measuring method is similar to that in a case of the first example. $(T_t-T_p)/T_t \times 100[\%]$ as the proportion of the transmitted-scattered light was obtained based on the measurement result, and this was 2.1%. With the above results, it can be considered that the rectilinear transmittance for light having a wavelength of 938 nm is equal to or greater than 75%.

Then, a halogen lamp light source was observed through the optical member in this example, in a dark room by using a camera which was able to detect infrared light. As a result, hazing was slightly viewed from an image, but the halogen lamp light source was possible to be visually recognized from the image. The extent of the occurrence of hazing was slightly larger than that in the first example.

If the optical member in this example was visually recognized from a side (first side) on which the convex-concave surface of the multilayer film was filled with resin, the optical member was observed to be white. If the optical member in this example was visually recognized from a side (second side) on which the convex-concave surface of the multilayer film was not filled with resin, the optical member was also observed to be white.

In the above-described manner, the optical member in which an incident ray of light was reflected and scattered in the visible wavelength range and the incident ray of light was transmitted in the infrared region of 900 nm or greater was obtained.

Example 3

This example is one example of the optical member 30 using a convex-concave surface, as illustrated in FIGS. 8A and 8B. Firstly, a multilayer film having a configuration shown in Table 2 was formed on a glass substrate similar to that in Example 2, similarly to Example 1.

The convex-concave surface on the substrate is a surface on which multiple concave lens units 343 which have a spherical shape and have an average pitch of 60 µm are provided, similar to the second example. The convex-concave surface has irregularity such that the vertex position of each of lens units 343 is positioned in a range of the radius corresponding to 25% of a pitch with respect to a honeycomb arrangement which is set as a reference and has the pitch of 60 µm. Such a convex-concave surface was formed in a manner that one surface of the glass substrate was subjected to wet etching by using a Mo mask which had an initial opening of a diameter of 3 µm at a position corresponding to the vertex position of each of the lens units 343. An average curvature radius of the lens units 343 on the convex-concave surface was calculated to 145 µm. An average angle of inclination at a boundary portion between the adjacent lens units 343, that is, at an end portion of each of the lens units 343 was calculated to 13°. The angle is a value smaller than 0.5×sin(1/1.51). In the convex-concave surface of the base member in this example, a region in which the angle of inclination is within 0.5×a sin(1/1.51) is 100% of an effective area to which visible light is incident. An average of r/R of the lens units 343 is 0.22. The plan view of the element was observed as a structure having a ridgeline which was similar to that in FIGS. 9A and 9B. The width w of all concave portions in the effective area to which visible light is incident was equal to or greater than 5 µm. An average width of the concave portions is about 60 µm.

Then, the convex-concave surface on which the multilayer film had been formed was filled with resin having a refractive index of 1.51 at a wavelength of 950 nm and was flattened. Then, the resin was sealed by the opposing glass substrate. In this manner, the optical member 30 in this example was manufactured.

FIG. 20 illustrates measurement results of the quantity of transmitted light through the optical member 30 in this example, which are obtained by a spectrometer. As illustrated in FIG. 20, the light quantity of transmitted light at a wavelength of 950 nm through the optical member 30 in this example was 89.7%. The measurement results illustrated in FIG. 20 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 98.0%. The light quantity of scattered light which does not reach the spectrometer is calculated to be equal to or smaller than 2.0%.

The proportion of transmitted-scattered light to the transmitted light at 938 nm through the optical member 30 in this example was measured by using a laser diode having a wavelength of 938 nm. A measuring method is similar to that in a case of the first example. $(T_t-T_p)/T_t \times 100[\%]$ as the proportion of the transmitted-scattered light was obtained based on the measurement result, and this was 0.57%. With the above results, it can be considered that the rectilinear transmittance for light having a wavelength of 938 nm is equal to or greater than 75%.

Then, a halogen lamp light source was observed through the optical member in this example, in a dark room by using a camera which was able to detect infrared light. As a result, hazing was slightly viewed from an image, but the halogen lamp light source was possible to be visually recognized from the image. The extent of the occurrence of hazing was slightly smaller than that in the first example.

If the optical member in this example was visually recognized from a side (first side) on which the convex-concave surface of the multilayer film was filled with resin, the optical member was observed to be white. If the optical member in this example was visually recognized from a side (second side) on which the convex-concave surface of the multilayer film was not filled with resin, the optical member was also observed to be white.

In the above-described manner, the optical member in which an incident ray of light was reflected and scattered in the visible wavelength range and the incident ray of light was transmitted in the infrared region of 900 nm or greater was obtained.

Example 4

This example is one example of the optical member 30 using a convex-concave surface, as illustrated in FIGS. 8A and 8B. Firstly, a multilayer film having a configuration shown in Table 2 was formed on a glass substrate which had a refractive index of 1.51 at a wavelength of 950 nm and had a thickness of 1.0 mm and which had a convex-concave surface, similarly to Example 1.

The convex-concave surface on the substrate was formed by sandblasting with an abrasive having a particle size of #240. The convex-concave surface was configured by concave portions and convex portions having various sizes. A part of the convex-concave surface, which caused the angle of inclination to be equal to or larger than 0.5×a sin(1/1.51) was also observed.

Figure 22:
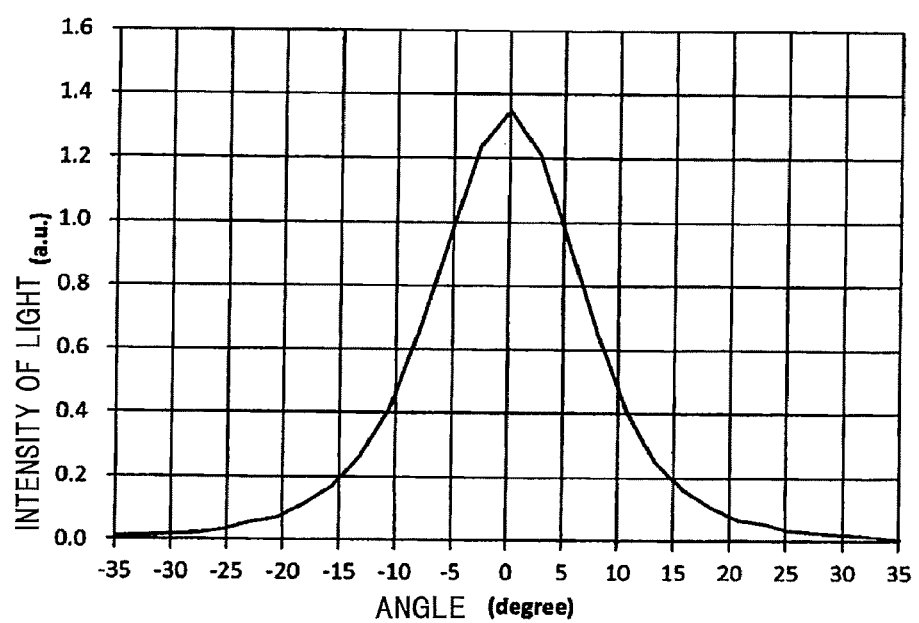
FIG. 22 is a graph illustrating a measurement result of light intensity of scattered light by a convex-concave surface of the base member of the optical member in the fourth example.

When the intensity depending on an angle (reflection scattering angle) of scattered light in a plane to which light having a wavelength of 450 nm was incident in a normal direction of an incident surface by using the convex-concave surface as the incident surface, and which was positioned at a distance of 85 mm from the base member was measured, a graph as illustrated in FIG. 22 was obtained. Here, the refractive index of the base member at a wavelength of 450 nm is 1.53, and a value of δ which corresponds to α of 45° and is obtained from a relational expression of $\delta = a \sin [\sin \alpha \times \{(n_s^2 - \sin^2 \alpha)^{0.5} - \cos \alpha\}]$ is 27.3°. Thus, it is understood that the convex-concave surface includes a part causing the angle of inclination to be equal to or larger than 45°, from intensity distribution of scattered light.

Then, the convex-concave surface on which the multi-layer film had been formed was filled with resin having a refractive index of 1.51 at a wavelength of 950 nm. Then, the resin was sealed by the opposing glass substrate. In this manner, the optical member 30 in this example was manufactured.

FIG. 20 illustrates measurement results of the quantity of transmitted light through the optical member 30 in this example, which are obtained by a spectrometer. As illustrated in FIG. 20, the light quantity of transmitted light at a wavelength of 950 nm through the optical member 30 in this example was 85.2%. The measurement results illustrated in FIG. 20 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 93.5%. The light quantity of scattered light which does not reach the spectrometer is calculated to be equal to or smaller than 6.5%.

The proportion of transmitted-scattered light to the transmitted light at 938 nm through the optical member 30 in this example was measured by using a laser diode having a wavelength of 938 nm. A measuring method is similar to that in a case of the first example. $(T_t - T_p)/T_t \times 100[\%]$ as the proportion of the transmitted-scattered light was obtained based on the measurement result, and this was 3.9%. With the above results, it can be considered that the rectilinear transmittance for light having a wavelength of 938 nm is equal to or greater than 75%.

Then, a halogen lamp light source was observed through the optical member in this example, in a dark room by using a camera which was able to detect infrared light. As a result, although the halogen lamp light source was possible to be visually recognized from an image, hazing of the image occurred largely and thus visibility was degraded. The extent of the occurrence of hazing was larger than that in the second example.

If the optical member in this example was visually recognized from the first side which was a side of the base member on which the convex-concave surface was formed, the optical member was observed to be white.

As described above, the optical member in which an incident ray of light was reflected and scattered in the visible wavelength range and the incident ray of light was transmitted in the infrared region of 900 nm or greater was obtained.

Example 5

This example is one example of the optical member 50 using cholesteric-phase liquid crystal which shows reflection and scattering, as illustrated in FIG. 15.

A cholesteric-phase liquid crystal layer in which the center of a selective reflection band was 550 nm was formed by injecting a cholesteric-phase liquid crystal material to a glass cell in which a gap between substrates was 5 μm and which was not subjected to aligned treatment. In this manner, the optical member 50 in this example was manufactured.

The formed cholesteric-phase liquid crystal layer is not subjected to the aligned treatment. Thus, regions having different aligned axes are provided in a plane, and a configuration which exhibits reflection and scattering in the selective reflection band which has been set is made. If the formed optical member 50 is visually recognized from each side of the substrates which interpose the cholesteric-phase liquid crystal layer, any optical member is observed to be green.

Figure 21:
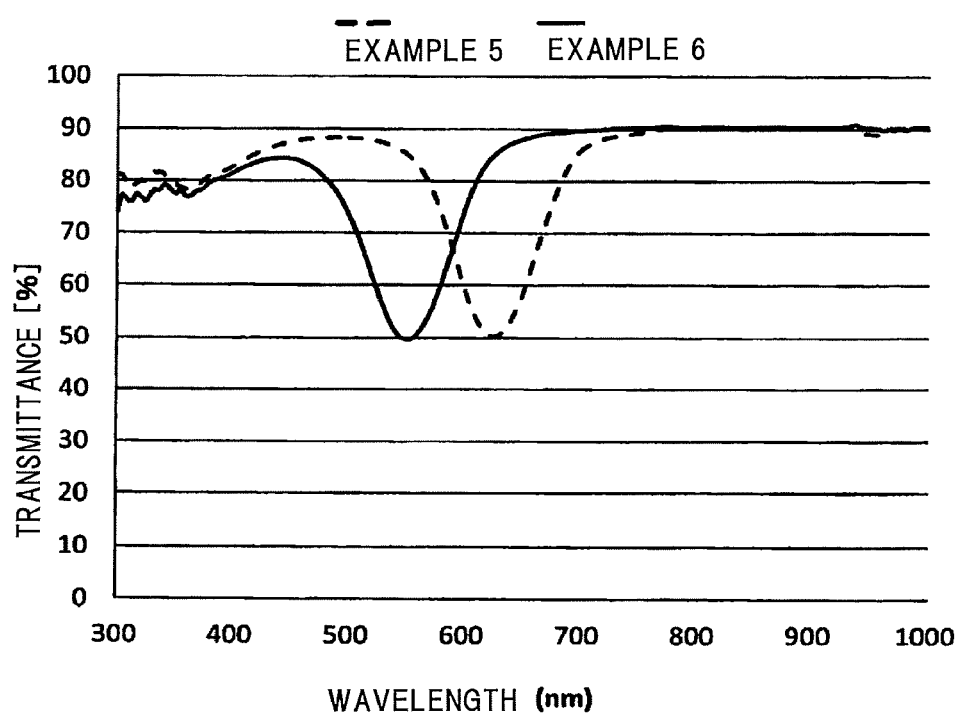
FIG. 21 is a graph illustrating measurement results of the quantity of transmitted light through an optical member in fifth and sixth examples.

FIG. 21 illustrates measurement results of the quantity of transmitted light through the optical member 50 in this example, which are obtained by a spectrometer. As illustrated in FIG. 21, the light quantity (transmittance) of transmitted light at a wavelength 550 nm through the optical member 50 in this example is reduced by the reflection and scattering. On the contrary, the light quantity of transmitted light at a wavelength of 950 nm has a high value. Specifically, the light quantity of transmitted light at a wavelength of 950 nm was 90.3%. Since the antireflection structure is not provided on both surfaces of the glass cell even in the optical member 50 in this example, reflection of about 8% is caused.

As described above, according to this example, the optical member in which light in at least a portion of the visible wavelength range was reflected and scattered and infrared light of 900 nm or greater was transmitted was obtained.

A mirror or an absorption material which exhibits reflection or absorption characteristics for visible light and transmits infrared light may be further installed on the optical member 50 in this example. If the mirror or an absorption material is installed, an optical member on which the quantity of transmitted light in the visible wavelength range is smaller is obtained.

Example 6

This example is one example of the optical member 50 using cholesteric-phase liquid crystal which shows reflection and scattering, as illustrated in FIG. 15.

A cholesteric-phase liquid crystal layer in which the center of a selective reflection band was 620 nm was formed by injecting a cholesteric-phase liquid crystal material to a glass cell in which a gap between substrates was 5 μm and which was not subjected to aligned treatment. In this manner, the optical member 50 in this example was manufactured.

The formed cholesteric-phase liquid crystal layer is not subjected to the aligned treatment. Thus, regions having different aligned axes are provided in a plane, and a configuration which exhibits reflection and scattering in the selective reflection band which has been set is made. If the formed optical member 50 is visually recognized from each side of the substrates which interpose the cholesteric-phase liquid crystal layer, any optical member is observed to be orange.

FIG. 21 illustrates measurement results of the quantity of transmitted light through the optical member 50 in this example, which are obtained by a spectrometer. As illustrated in FIG. 21, the light quantity of transmitted light at a wavelength 620 nm through the optical member 50 in this example is reduced by the reflection and scattering. On the contrary, the light quantity of transmitted light at a wavelength of 950 nm has a high value. Specifically, the light quantity of transmitted light at a wavelength of 950 nm was 89.1%. Since the antireflection structure is not provided on both surfaces of the glass cell even in the optical member 50 in this example, reflection of about 8% is caused. With the above results, it can be considered that the rectilinear transmittance for light having a wavelength of 950 nm is equal to or greater than 75%.

As described above, according to this example, the optical member in which light in at least a portion of the visible wavelength range was reflected and scattered and infrared light of 900 nm or greater was transmitted was obtained.

A mirror or an absorption material which exhibits reflection or absorption characteristics for visible light and transmits infrared light may be further installed on the optical member 50 in this example. If the mirror or an absorption material is installed, an optical member on which the quantity of transmitted light in the visible wavelength range is smaller is obtained.

Example 7

This example is one example of the optical member 50 using cholesteric-phase liquid crystal which shows reflection and scattering, as illustrated in FIG. 15.

A cell is formed by two glass substrates so as to cause a gap between the substrates to be 5 μm. At this time, aligned treatment such as rubbing is not subjected to the glass substrates. Such three cells are prepared. Three kinds of cholesteric-phase liquid crystal layers in which the center of a selective reflection band is 430 nm, 530 nm, and 630 nm are formed by injecting a cholesteric-phase liquid crystal material to each of the cells. Each cholesteric-phase liquid crystal layer is not subjected to the aligned treatment. Thus, a region in which a plurality of aligned axes is provided is formed in the cholesteric-phase liquid crystal layer, and the cholesteric-phase liquid crystal layer exhibits reflection and scattering in each selective reflection band.

The cholesteric-phase liquid crystal layers are layered, and a multilayer film which has a configuration shown in Table 1 is further formed on the resultant of the layering. In the above-described manner, the optical member in which an incident ray of light was reflected and scattered in the visible wavelength range and the incident ray of light was transmitted in the infrared region of 900 nm or greater was obtained.

Example 8

Figure 23:
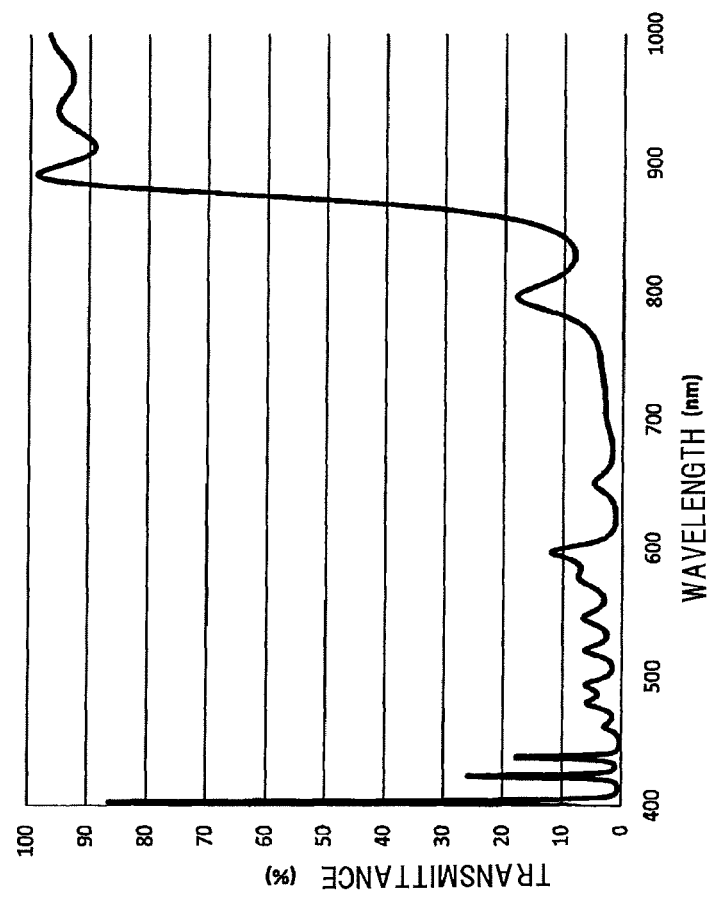
FIG. 23 is a graph illustrating transmittance characteristics of the multilayer film as the selective reflection unit.

This example is one example of the optical member 30 using a convex-concave surface, as illustrated in FIGS. 8A and 8B. Firstly, a multilayer film which was formed from $SiO_2$ and $Ta_2O_5$ and had a configuration shown in Table 3 was formed on a glass substrate similar to that in Example 4. The transmittance spectrum calculated by using the optical member is as in FIG. 23. The calculation was performed on the assumption that the material of the incident side was also set to be a material having the same refractive index dispersion as that of the base member.

TABLE 3

| Layer no. | Material | Thickness (nm) |
|---|---|---|
| 1 | $SiO_2$ | 121 |
| 2 | $Ta_2O_5$ | 61 |
| 3 | $SiO_2$ | 86 |
| 4 | $Ta_2O_5$ | 53 |
| 5 | $SiO_2$ | 76 |
| 6 | $Ta_2O_5$ | 51 |
| 7 | $SiO_2$ | 87 |
| 8 | $Ta_2O_5$ | 64 |
| 9 | $SiO_2$ | 40 |
| 10 | $Ta_2O_5$ | 32 |
| 11 | $SiO_2$ | 105 |
| 12 | $Ta_2O_5$ | 67 |
| 13 | $SiO_2$ | 100 |
| 14 | $Ta_2O_5$ | 48 |
| 15 | $SiO_2$ | 68 |
| 16 | $Ta_2O_5$ | 61 |
| 17 | $SiO_2$ | 112 |
| 18 | $Ta_2O_5$ | 78 |
| 19 | $SiO_2$ | 111 |
| 20 | $Ta_2O_5$ | 65 |
| 21 | $SiO_2$ | 64 |
| 22 | $Ta_2O_5$ | 34 |
| 23 | $SiO_2$ | 122 |
| 24 | $Ta_2O_5$ | 79 |
| 25 | $SiO_2$ | 115 |
| 26 | $Ta_2O_5$ | 75 |
| 27 | $SiO_2$ | 145 |
| 28 | $Ta_2O_5$ | 80 |
| 29 | $SiO_2$ | 127 |
| 30 | $Ta_2O_5$ | 76 |
| 31 | $SiO_2$ | 106 |
| 32 | $Ta_2O_5$ | 63 |
| 33 | $SiO_2$ | 150 |
| 34 | $Ta_2O_5$ | 53 |
| 35 | $SiO_2$ | 87 |
| 36 | $Ta_2O_5$ | 124 |
| 37 | $SiO_2$ | 87 |
| 38 | $Ta_2O_5$ | 57 |
| 39 | $SiO_2$ | 31 |
| 40 | $Ta_2O_5$ | 25 |
| 41 | $SiO_2$ | 90 |
| 42 | $Ta_2O_5$ | 58 |
| 43 | $SiO_2$ | 98 |
| Base member | | |

The convex-concave surface on the substrate was formed by frost processing and was formed in a manner that sandblasting with an abrasive having a particle size of #800 was performed and wet etching was performed so as to cause the etched amount of both surfaces of the substrate to be 85 μm in total.

Figure 24:
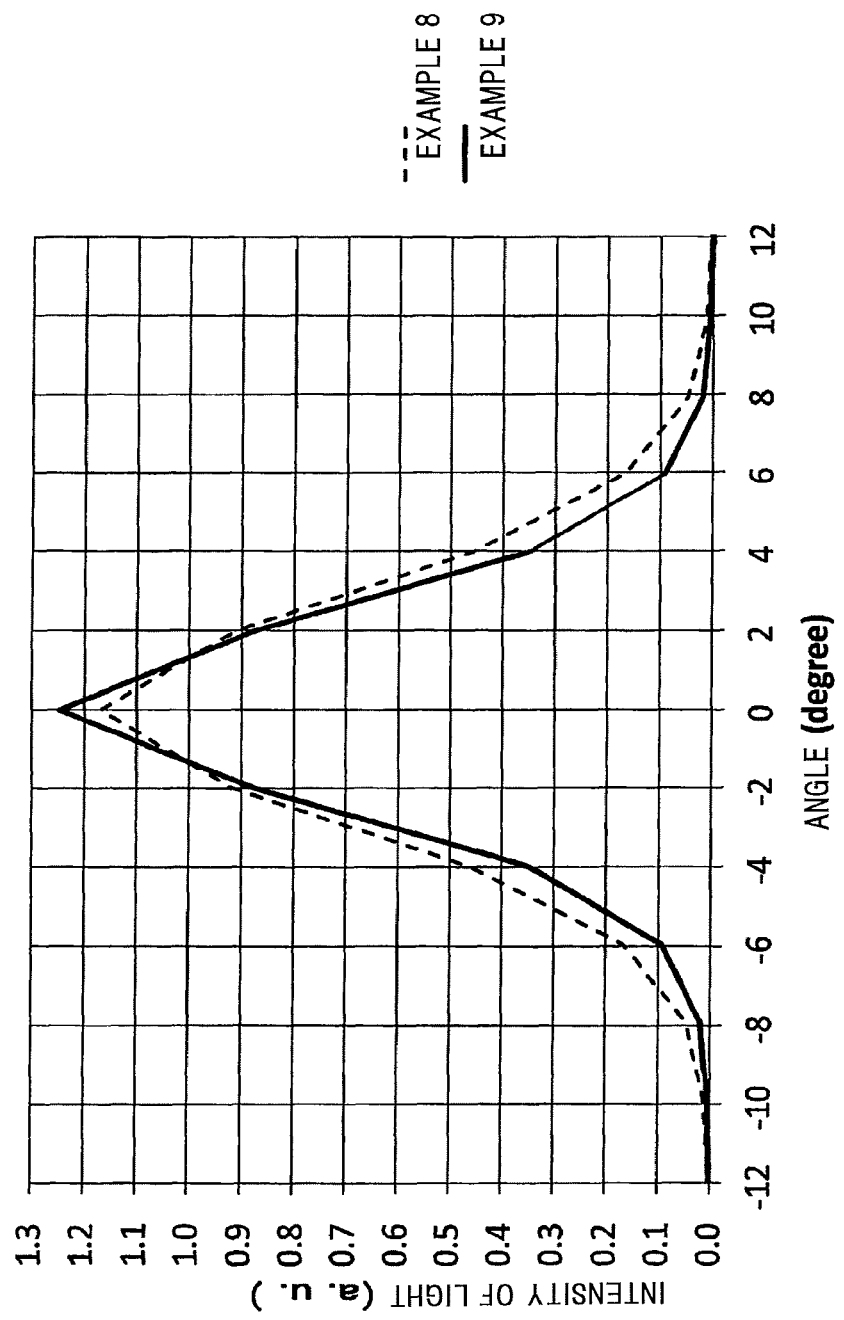
FIG. 24 is a graph illustrating measurement results of light intensity of scattered light by a convex-concave surface of a base member of an optical member in eighth and ninth examples.

When the intensity depending on an angle (reflection scattering angle) of scattered light in a plane to which light having a wavelength of 450 nm was incident in a normal direction of an incident surface by using the convex-concave surface as the incident surface, and which was positioned at a distance of 85 mm from the base member was measured, a graph as illustrated in FIG. 24 was obtained. Here, the refractive index of the base member at a wavelength of 450 nm is 1.53, and a value of δ which corresponds to α of 45° and is obtained from a relational expression of $\delta = a \sin[\sin \alpha \times \{(n_s^2 - \sin^2 \alpha)^{0.5} - \cos \alpha\}]$ is 27.3°. Thus, it is understood that the convex-concave surface hardly includes a part causing the angle of inclination to be equal to or larger than 45°, from intensity distribution of scattered light.

Then, the convex-concave surface on which the multilayer film had been formed was filled with resin having a refractive index of 1.51 at a wavelength of 950 nm and was flattened. Then, the resin was sealed by the opposing glass substrate. In this manner, the optical member 30 in this example was manufactured.

Figure 25:
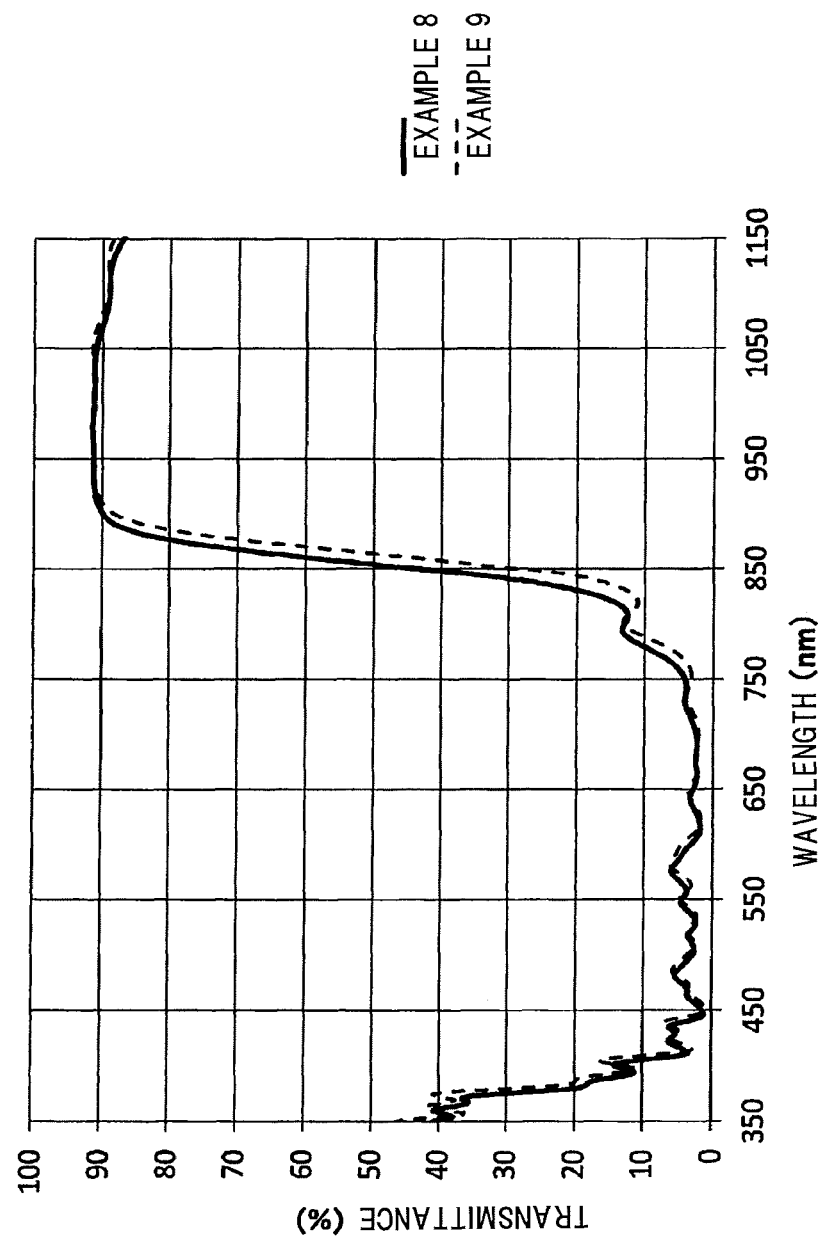
FIG. 25 is a graph illustrating measurement results of the quantity of transmitted light through the optical member in the eighth and ninth examples.

FIG. 25 illustrates measurement results of the quantity of transmitted light through the optical member 30 in this example, which are obtained by a spectrometer. As illustrated in FIG. 25, the light quantity (transmittance) of transmitted light at a wavelength of 950 nm through the optical member 30 in this example was 91.2%. The measurement results illustrated in FIG. 25 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 99.5%. The light quantity of scattered light which does not reach the spectrometer is calculated to be equal to or smaller than 0.5%.

The proportion of transmitted-scattered light to the transmitted light at 938 nm through the optical member 30 in this example was measured by using a laser diode having a wavelength of 938 nm. A measuring method is similar to that in a case of the first example. $(T_t-T_p)/T_t \times 100[\%]$ as the proportion of the transmitted-scattered light was obtained based on the measurement result, and this was 0.76%. With the above results, it can be considered that the rectilinear transmittance for light having a wavelength of 938 nm is equal to or greater than 75%.

Then, a halogen lamp light source was observed through the optical member in this example, in a dark room by using a camera which was able to detect infrared light. As a result, although the halogen lamp light source was possible to be visually recognized from an image.

If the optical member in this example was visually recognized from the first side which was a side of the base member on which the convex-concave surface was formed, the optical member was observed to be white.

As described above, the optical member in which an incident ray of light was reflected and scattered in the visible wavelength range and the incident ray of light was transmitted in the infrared region of 900 nm or greater was obtained.

Example 9

This example is one example of the optical member 30 using a convex-concave surface, as illustrated in FIGS. 8A and 8B. Firstly, a multilayer film having a configuration shown in Table 3 was formed on a glass substrate similar to that in Example 4, similarly to Example 8. The transmittance spectrum calculated by using the optical member is as in FIG. 23.

The convex-concave surface on the substrate was formed by frost processing and was formed in a manner that sandblasting with an abrasive having a particle size of #800 was performed and wet etching was performed so as to cause the etched amount of both surfaces of the substrate to be 115 μm in total.

When the intensity of scattered light in a plane to which light having a wavelength of 450 nm was incident in a normal direction of an incident surface by using the convex-concave surface as the incident surface, and which was positioned at a distance of 85 mm from the base member was measured, a graph as illustrated in FIG. 24 was obtained. Here, the refractive index of the base member at a wavelength of 450 nm is 1.53, and a value of δ which corresponds to α of 45° and is obtained from a relational expression of $\delta = a\sin[\sin\alpha \times \{(n_s^2 - \sin^2\alpha)^{0.5} - \cos\alpha\}]$ is 27.3°. Thus, it is understood that the convex-concave surface hardly includes a part causing the angle of inclination to be equal to or larger than 45°, from intensity distribution of scattered light.

Then, the convex-concave surface on which the multilayer film had been formed was filled with resin having a refractive index of 1.51 at a wavelength of 950 nm and was flattened. Then, the resin was sealed by the opposing glass substrate. In this manner, the optical member 30 in this example was manufactured.

FIG. 25 illustrates measurement results of the quantity of transmitted light through the optical member 30 in this example, which are obtained by a spectrometer. As illustrated in FIG. 25, the light quantity of transmitted light at a wavelength of 950 nm through the optical member 30 in this example was 91.3%. The measurement results illustrated in FIG. 25 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 99.6%. The light quantity of scattered light which does not reach the spectrometer is calculated to be equal to or smaller than 0.4%.

The proportion of transmitted-scattered light to the transmitted light at 938 nm through the optical member 30 in this example was measured by using a laser diode having a wavelength of 938 nm. A measuring method is similar to that in a case of the first example. $(T_t-T_p)/T_t \times 100[\%]$ as the proportion of the transmitted-scattered light was obtained based on the measurement result, and this was 0.32%. With the above results, it can be considered that the rectilinear transmittance for light having a wavelength of 938 nm is equal to or greater than 75%.

Then, a halogen lamp light source was observed through the optical member in this example, in a dark room by using a camera which was able to detect infrared light. As a result, although the halogen lamp light source was possible to be visually recognized from an image.

If the optical member in this example was visually recognized from the first side which was a side of the base member on which the convex-concave surface was formed, the optical member was observed to be white.

As described above, the optical member in which an incident ray of light was reflected and scattered in the visible wavelength range and the incident ray of light was transmitted in the infrared region of 900 nm or greater was obtained.

Example 10

This example is one example of the optical member 30 using a convex-concave surface, as illustrated in FIGS. 8A and 8B. Firstly, a multilayer film having a configuration shown in Table 3 was formed on a glass substrate similar to that in Example 2, similarly to Example 8.

The convex-concave surface on the substrate is a surface on which multiple concave lens units 343 which are irregularly arranged as illustrated in FIGS. 9A and 9B and have a spherical shape. Each of the lens units 343 is positioned in a honeycomb arrangement which is set as a reference and has a pitch of 30 μm, so as to position a vertex position in a range of the radius corresponding to 10% of the pitch. Such a convex-concave surface was formed in a manner that one surface of the glass substrate was subjected to wet etching by using a Mo mask which had an initial opening of a diameter of 3 μm at a position corresponding to the vertex position of each of the lens units 343. An average curvature radius of the lens units 343 on the convex-concave surface was calculated to 41 μm. An average angle of inclination at a boundary portion between the adjacent lens units 343, that is, at an end portion of each of the lens units 343 was calculated to 23°. The angle has a value which is slightly larger than 20° which is 0.5×sin(1/1.51). An average of r/R of the lens units 343 is 0.39. The plan view of the element was observed as a structure having a ridgeline which was similar to that in FIGS. 9A and 9B. The width w of all concave portions in the effective area to which visible light is incident was equal to or greater than 5 μm. An average width of the concave portions is about 30 μm.

Then, the convex-concave surface on which the multilayer film had been formed was filled with resin having a refractive index of 1.51 at a wavelength of 950 nm. Then, the resin was sealed by the opposing glass substrate. In this manner, the optical member 30 in this example was manufactured.

Figure 26:
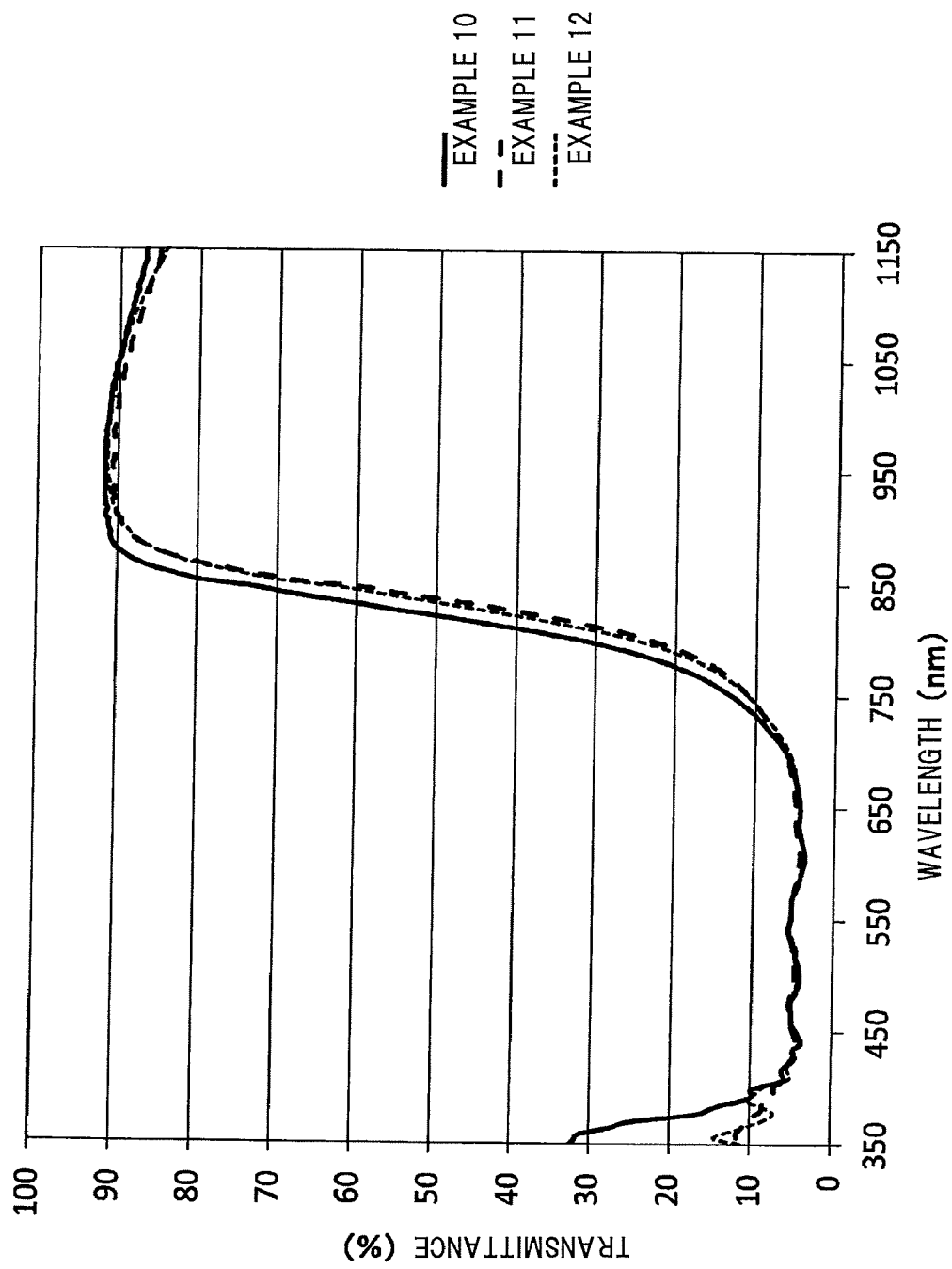
FIG. 26 is a graph illustrating measurement results of the quantity of transmitted light through an optical member in tenth to twelfth examples.

FIG. 26 illustrates measurement results of the quantity of transmitted light through the optical member 30 in this example, which are obtained by a spectrometer. As illustrated in FIG. 26, the light quantity (transmittance) of transmitted light at a wavelength of 950 nm through the optical member 30 in this example was 91.7%. The measurement results illustrated in FIG. 26 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 100%.

The proportion of transmitted-scattered light to the transmitted light at 938 nm through the optical member 30 in this example was measured by using a laser diode having a wavelength of 938 nm. $(T_t-T_p)/T_t \times 100[\%]$ as the proportion of the transmitted-scattered light was obtained based on the measurement result, and this was 4.7%. With the above results, it can be considered that the rectilinear transmittance for light having a wavelength of 938 nm is equal to or greater than 75%.

Example 11

Figure 27:
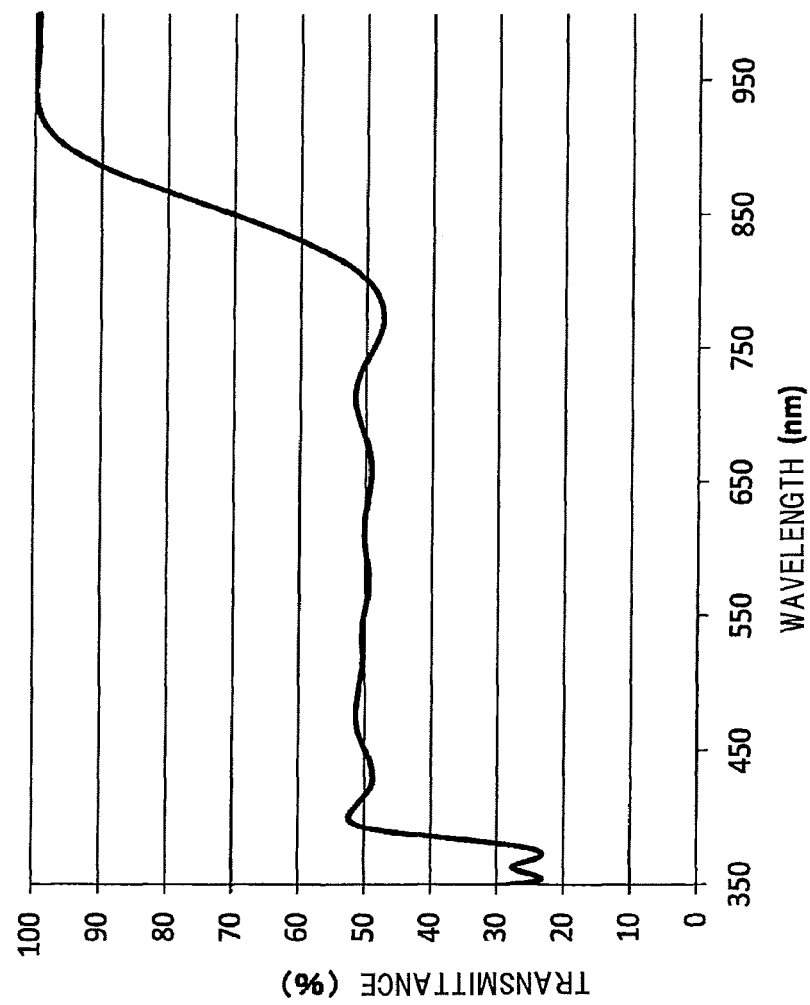
FIG. 27 is a graph illustrating transmittance characteristics of the multilayer film as the selective reflection unit.

This example is one example of an optical member obtained by layering the optical member 30 using a convex-concave surface, as illustrated in FIGS. 8A and 8B, and the optical member in the tenth example. Firstly, a multilayer film which was formed from $SiO_2$ and $Ta_2O_5$ and had a configuration shown in Table 4 was formed on a glass substrate similar to that in Example 2. The transmittance spectrum calculated by using the optical member is as in FIG. 27. The calculation was performed on the assumption that the material of the incident side was also set to be a material having the same refractive index dispersion as that of the base member.

TABLE 4

| Layer no. | Material | Thickness (nm) |
| --- | --- | --- |
| 1 | $SiO_2$ | 79 |
| 2 | $Ta_2O_5$ | 11 |
| 3 | $SiO_2$ | 50 |

TABLE 4-continued

| Layer no. | Material | Thickness (nm) |
| --- | --- | --- |
| 4 | $Ta_2O_5$ | 34 |
| 5 | $SiO_2$ | 37 |
| 6 | $Ta_2O_5$ | 31 |
| 7 | $SiO_2$ | 53 |
| 8 | $Ta_2O_5$ | 28 |
| 9 | $SiO_2$ | 34 |
| 10 | $Ta_2O_5$ | 50 |
| 11 | $SiO_2$ | 30 |
| 12 | $Ta_2O_5$ | 16 |
| 13 | $SiO_2$ | 104 |
| 14 | $Ta_2O_5$ | 78 |
| 15 | $SiO_2$ | 107 |
| 16 | $Ta_2O_5$ | 69 |
| 17 | $SiO_2$ | 133 |
| 18 | $Ta_2O_5$ | 31 |
| 19 | $SiO_2$ | 83 |
| 20 | $Ta_2O_5$ | 32 |
| 21 | $SiO_2$ | 111 |
| 22 | $Ta_2O_5$ | 31 |
| 23 | $SiO_2$ | 41 |
| 24 | $Ta_2O_5$ | 214 |
| 25 | $SiO_2$ | 37 |
| 26 | $Ta_2O_5$ | 20 |
| 27 | $SiO_2$ | 189 |
| Base member | | |

The convex-concave surface on the substrate is a surface on which multiple concave lens units 343 which are irregularly arranged as illustrated in FIGS. 9A and 9B and have a spherical shape. Each of the lens units 343 is positioned in a honeycomb arrangement which is set as a reference and has a pitch of 30 μm, so as to position a vertex position in a range of the radius corresponding to 10% of the pitch. Such a convex-concave surface was formed in a manner that one surface of the glass substrate was subjected to wet etching by using a Mo mask which had an initial opening of a diameter of 3 μm at a position corresponding to the vertex position of each of the lens units 343. An average curvature radius of the lens units 343 on the convex-concave surface was calculated to 41 μm. An average angle of inclination at a boundary portion between the adjacent lens units 343, that is, at an end portion of each of the lens units 343 was calculated as in Table 5. Similarly, Table 5 shows an average of r/R of the lens units 343. The plan view of the element was observed as a structure having a ridgeline which was similar to that in FIGS. 9A and 9B. The width w of all concave portions in the effective area to which visible light is incident was equal to or greater than 5 μm. An average width of the concave portions is about 30 μm.

Then, the convex-concave surface on which the multilayer film had been formed was filled with resin having a refractive index of 1.51 at a wavelength of 950 nm and was flattened. Then, the resin was sealed by the opposing glass substrate. Then, the reflection-scattering unit which had been described by setting the visual recognition side as a first reflection-scattering unit was layered on the optical member 30 in Example 10.

FIG. 26 illustrates measurement results of the quantity of transmitted light through the optical member 30 in this example, which are obtained by a spectrometer. As illustrated in FIG. 26, the light quantity of transmitted light at a wavelength of 950 nm through the optical member in this example was 90.6%. The measurement results illustrated in FIG. 26 are measurement results obtained by a configuration in which antireflection processing is not performed on surfaces of two glass substrates as the base members. Thus, if it is considered that the light quantity of reflected light on the above surfaces is generally 8.3%, in a case where an antireflection structure is formed on the surfaces of the two glass substrates, the maximum light quantity of transmitted light at a wavelength of 950 nm through the optical member 30 in this example may be 98.9%. The light quantity of scattered light which does not reach the spectrometer is calculated to be equal to or smaller than 1.1%.

The proportion of transmitted-scattered light to the transmitted light at 938 nm through the optical member 30 in this example was measured by using a laser diode having a wavelength of 938 nm. $(T_t-T_p)/T_t \times 100[\%]$ as the proportion of the transmitted-scattered light was obtained based on the measurement result, and this was 4.7%. With the above results, it can be considered that the rectilinear transmittance for light having a wavelength of 938 nm is equal to or greater than 75%.

Here, when Examples 2, 3, 8 to 11 were observed by the eyes, granularity was observed on the surface of the optical member other than the optical members in Example 10 and Example 11. Since the housing member has texture without granularity, the member in Example 10 and Example 11 has texture which is approximate to the housing member.

The CIE1976 (L*, a*, b*) color space of the optical member in Examples 9 to 11 was measured, and the result was as in Table 5. The color space of the housing member which had been visually recognized along with the optical member was measured, and the result was as in Table 5. Thus, the result obtained by calculating ΔE and ΔE2 is as in Table 5, and all of ΔE and ΔE2 is equal to or smaller than 6.5. Accordingly, it can be difficult to visually recognize the optical member with respect to the housing member. Although L* in Example 10 is greater than that of the housing member, it is possible to decrease L* by adjusting the total light quantity of reflected light. The color space is measured by using Color i7 manufactured by X-rite Corporation. At a time of measurement, the measurement is performed in a state where each of the optical members is installed on a holding tool of Color i7, and the color space is calculated by using D65 as the light source.

Figure 28:
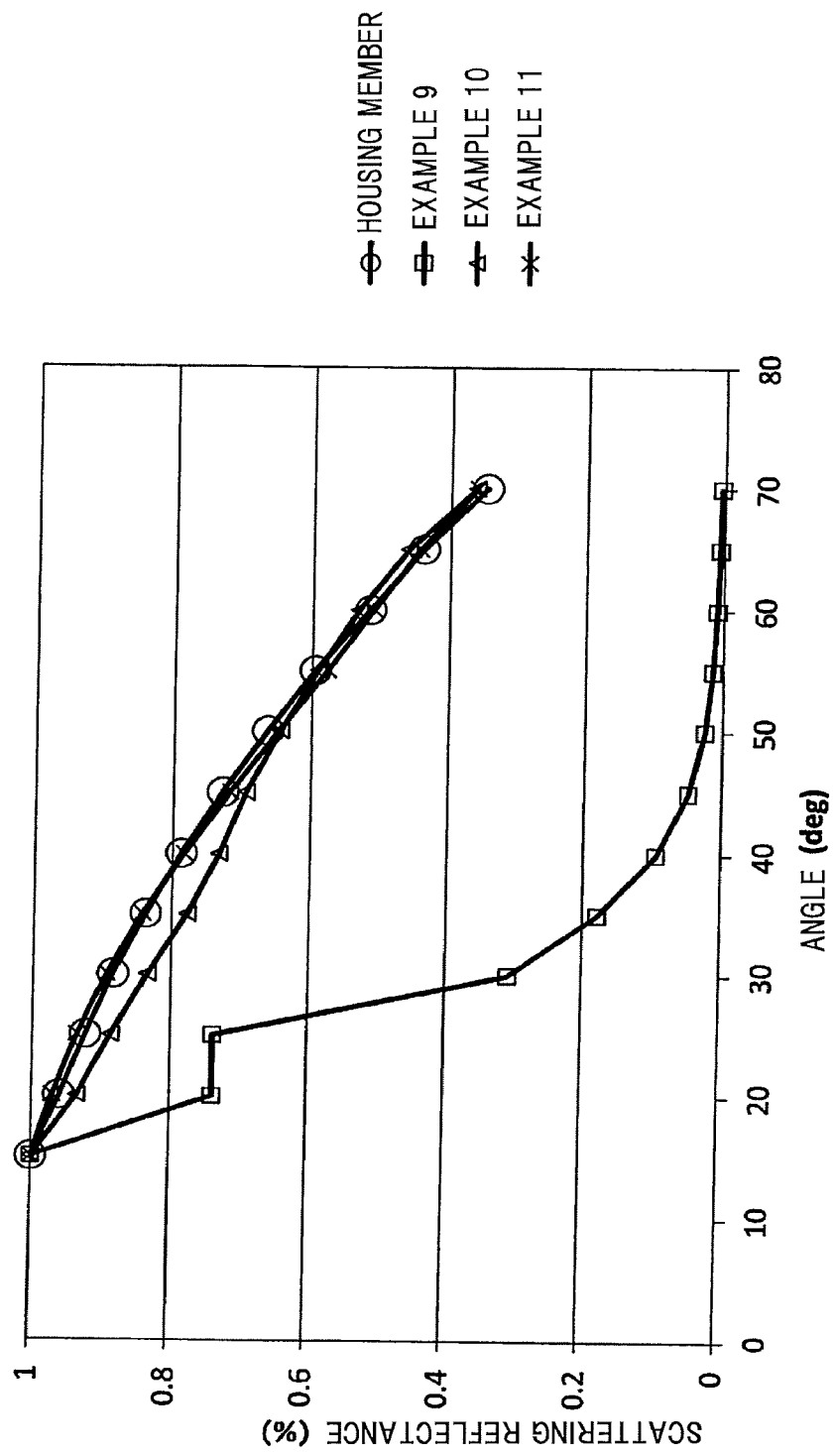
FIG. 28 is a graph illustrating angle dependency of reflected-scattered light of the optical member and a housing member in the ninth to eleventh examples.

FIG. 28 illustrates results obtained by measuring the intensity (scattering reflectance) depending on an angle (reflection scattering angle) of reflected-scattered light, that is, by measuring the angle dependency of the scattered light. In FIG. 28, standardization is performed by the intensity of reflected-scattered light at 15° and the maximum measurement angle is set to 70°. An average value of light having a wavelength of 410 to 700 nm is obtained as the scattering reflectance. Here, when the absolute value of a value of $(I_f(\psi)-I_b(\psi))/I_b(\psi)$ is calculated, in a range of an angle which is equal to or smaller than 70°, the value in Example 10 is 0.07 and the value in Example 11 is 0.03. Although a case of Example 9 is also illustrated, in a case of the Example 9, the proportion of reflected-scattered light is large at a relatively small angle and glossy feeling is shown. Since the housing member has small glossy feeling, the member in Example 10 and Example 11 has texture which is approximate to the housing member.

This application is based upon Japanese Patent Application No. 2015-007889, filed Jan. 19, 2015, the entire contents of which are incorporated herein by reference.

INDUSTRIAL APPLICABILITY

The present invention can be suitably utilized in various devices using infrared light.

DESCRIPTION OF REFERENCE NUMERALS

100 OPTICAL DEVICE
101a, 101b INFRARED LIGHT
102, 102a, 102b, 102c, 102d VISIBLE LIGHT
103 INSPECTION LIGHT
1, 10, 20, 30, 40, 50, 60, 70 OPTICAL MEMBER
2 INFRARED-LIGHT EMITTING UNIT
3 INFRARED-LIGHT RECEIVING UNIT
301 EFFECTIVE AREA
4 HOUSING
11, 21, 31, 41, 51, 61, 71 REFLECTION-SCATTERING UNIT

TABLE 5

| | First reflection-scattering unit | | | | | Second reflection-scattering unit | | |
|---|---|---|---|---|---|---|---|---|
| | Multilayer film | Average value of width w Unit (μm) | Average curvature radius (μm) | Average inclination at end portion Unit (deg) | Average r/R | Multilayer film | Average value of width w Unit (μm) | curvature radius (μm) |
| Example 2 | Table 2 | 60 | 100 | 18.4 | 0.32 | None | | |
| Example 3 | Table 2 | 60 | 145 | 12.6 | 0.22 | None | | |
| Example 8 | Table 3 | — | — | — | — | None | | |
| Example 9 | Table 3 | — | — | — | — | None | | |
| Example 10 | Table 3 | 30 | 41 | 22.7 | 0.39 | None | | |
| Example 11 | Table 4 | 30 | 41 | 22.7 | 0.39 | Table 3 | 30 | 41 |
| Housing member | | | — | | | | — | |

| | Transmittance at 950 nm Unit (%) | $(T_t - T_p)/T_t \times 100$ Unit (%) | L* | a* | b* | ΔE | ΔE2 | Granularity |
|---|---|---|---|---|---|---|---|---|
| Example 2 | 90.2 | 2.1 | — | — | — | — | — | Felt |
| Example 3 | 89.7 | 0.57 | — | — | — | — | — | Felt |
| Example 8 | 91.2 | 0.76 | — | — | — | — | — | Felt |
| Example 9 | 91.3 | 0.32 | 95.8 | −0.3 | 0.7 | 44 | 1.0 | Felt |
| Example 10 | 91.7 | 4.7 | 95.4 | 0.1 | 0.8 | 42 | 1.4 | Small |
| Example 11 | 90.6 | 4.7 | 91.9 | −0.4 | 0.2 | 09 | 0.8 | Small |
| Housing member | — | — | 91.5 | −1.2 | 0.2 | — | — | None |

12 SCATTERING UNIT
13 SELECTIVE REFLECTION UNIT
14 BASE MEMBER
22 DIFFRACTIVE STRUCTURE
221 CONVEX PORTION
222 CONCAVE PORTION
34a, 44a FIRST BASE MEMBER
34b, 44b SECOND BASE MEMBER
33 SELECTIVE REFLECTION FILM
331a, 331b, 341a, 341b CONVEX-CONCAVE SURFACE
342a, 342b CONVEX-CONCAVE STRUCTURE
343 LENS UNIT
345 RIDGELINE
346 EMISSION INTERFACE
43, 53 CHOLESTERIC-PHASE LIQUID CRYSTAL LAYER
431a, 431b, 441a, 441b CONVEX-CONCAVE SURFACE
442a, 442b CONVEX-CONCAVE STRUCTURE
46 SECOND SELECTIVE REFLECTION UNIT
62 FINE PARTICLE-CONTAINING RESIN LAYER
72 ABSORPTION MEMBER
73 REFLECTION MEMBER

The invention claimed is:

1. An optical member comprising:
a reflection-scattering unit, comprising:
a selective reflection unit that reflects light having a wavelength band which corresponds to at least a portion of the visible wavelength range and transmits light having a wavelength band which corresponds to at least a portion of the infrared region, and
a scattering unit that is provided at least on a first side of the selective reflection unit which comprises a diffractive structure configured to diffract the light having the wavelength band which corresponds to at least the portion of the visible wavelength range and scatters the light having the wavelength band which corresponds to at least the portion of the visible wavelength range, the first side being an incident side or an emission side of infrared light and being one predetermined side of sides to which visible light is incident;
wherein rectilinear transmittance for the light having the wavelength band which corresponds to at least the portion of the infrared region is equal to or greater than 75%, and
reflection-(0)th-diffraction efficiency for the light having the wavelength band which corresponds to at least the portion of the visible wavelength range is smaller than 30%.

2. The optical member according to claim 1, further comprising:
a second reflection member or an absorption member which is provided on a second side of the reflection-scattering unit, which is not the first side which is an incident side or an emission side of infrared light and is a predetermined side of sides to which visible light is incident,
wherein the second reflection member reflects visible light and transmits the light having the wavelength band which corresponds to at least the portion of the infrared region, and
the absorption member absorbs visible light and transmits the light having the wavelength band which corresponds to at least the portion of the infrared region.

3. The optical member according to claim 1, wherein
the visible wavelength range corresponds to a range of 400 to 750 nm, and
the infrared region corresponds to a range of 800 to 1,000 nm.

4. An optical device comprising:
a light emitting unit that emits light having a wavelength band which corresponds to a portion of an infrared region, or a light receiving unit configured to receive light having a wavelength band which corresponds to a portion of the infrared region;
a housing that encloses the light emitting unit or the light receiving unit; and
an infrared-light transmission filter which is provided at an opening portion of the housing and is surrounded by at least one member of the housing,
wherein the infrared-light transmission filter is the optical member according to claim 1.

5. The optical device according to claim 4, wherein
when a difference of a* for the infrared-light transmission filter and the at least one member of the housing surrounding the infrared-light transmission filter is set as $\Delta a^*$, a difference of b* for the infrared-light transmission filter and the at least one member of the housing surrounding the infrared-light transmission filter is set as $\Delta b^*$, and $\Delta E2 = (\Delta a^{*2} + \Delta b^{*2})^{0.5}$ is set to be satisfied in a L*a*b* color system,
$\Delta E2$ is equal to or smaller than 6.5.

6. The optical device according to claim 4, wherein
a color difference when a difference of L* for the infrared-light transmission filter and the at least one member of the housing surrounding the infrared-light transmission filter in the L*a*b* color system is set as $\Delta L^*$ is set as $\Delta E$, and
$\Delta E$ is equal to or smaller than 6.5.

7. The optical device according to claim 4, wherein
when angle dependency of reflected-scattered light on incident visible light is standardized by reflection-scattering intensity at any angle of 5° to 15°, intensity of reflected-scattered light at a certain angle $\psi$ by the infrared-light transmission filter is set as $I_f(\psi)$, and intensity of reflected-scattered light at the angle $\psi$ by the at least one member of the housing surrounding the infrared-light transmission filter which is arranged to be adjacent to the vicinity of the infrared-light transmission filter among members of the housing is set as $I_b(\psi)$,
an absolute value of a value of $(I_f(\psi) - I_b(\psi))/I_b(\psi)$ in a case where at least the angle $\psi$ is within 30° is equal to or smaller than 0.2.

8. The optical device according to claim 5, wherein
when angle dependency of reflected-scattered light on incident visible light is standardized by reflection-scattering intensity at any angle of 5° to 15°, intensity of reflected-scattered light at a certain angle $\psi$ by the infrared-light transmission filter is set as $I_f(\psi)$, and intensity of reflected-scattered light at the angle $\psi$ by the at least one member of the housing surrounding the infrared-light transmission filter which is arranged to be adjacent to the vicinity of the infrared-light transmission filter among members of the housing is set as $I_b(\psi)$,
an absolute value of a value of $(I_f(\psi) - I_b(\psi))/I_b(\psi)$ in a case where at least the angle $\psi$ is within 30° is equal to or smaller than 0.2.

9. The optical device according to claim 6, wherein
when angle dependency of reflected-scattered light on incident visible light is standardized by reflection-scattering intensity at any angle of 5° to 15°, intensity of reflected-scattered light at a certain angle ψ by the infrared-light transmission filter is set as $I_f(\psi)$, and intensity of reflected-scattered light at the angle ψ by the at least one member of the housing surrounding the infrared-light transmission filter which is arranged to be adjacent to the vicinity of the infrared-light transmission filter among members of the housing is set as $I_b(\psi)$,
an absolute value of a value of $(I_f(\psi)-I_b(\psi))/I_b(\psi)$ in a case where at least the angle ψ is within 30° is equal to or smaller than 0.2.

10. An optical member comprising:
a reflection-scattering unit, comprising:
a selective reflection unit that reflects light having a wavelength band which corresponds to at least a portion of the visible wavelength range and transmits light having a wavelength band which corresponds to at least a portion of the infrared region, and
a scattering unit that is provided at least on a first side of the selective reflection unit which comprises a convex-concave surface which is formed on a surface of a reflection member provided in the selective reflection unit, on at least the first side, and
refractive indices of a first base member and a second base member in the wavelength band corresponding to at least the portion of the infrared region are substantially the same as each other, the first base member being in contact with the surface of the reflection member on the first side, and the second base member being in contact with a surface of the reflection member on a second side which is not the first side and is the incident side or the emission side of the infrared light;
wherein rectilinear transmittance for the light having the wavelength band which corresponds to at least the portion of the infrared region is equal to or greater than 75%, and
the first side being an incident side or an emission side of infrared light and being one predetermined side of sides to which visible light is incident.

11. The optical member according to claim 10, wherein
the scattering unit comprises convex-concave surfaces which are formed on the surfaces of the reflection member provided in the selective reflection unit, on the first side and the second side, and
a convex-concave surface which has a convex-concave shape and is fit with the convex-concave surface of the reflection member on a side being in contact with the corresponding surface is formed on each of the surfaces of the first base member and the second base member on the sides being in contact with the reflection member.

12. The optical member according to claim 10, wherein
a convex-concave surface which has a convex-concave shape and is fit with the convex-concave surface of the reflection member on the side being in contact with the corresponding surface is formed on at least one of the surface of the first base member on the side being in contact with the reflection member and the surface of the second base member on the side being in contact with the reflection member, and
at least one of the convex-concave surfaces formed on the first base member and the second base member is formed by a lens array in which a plurality of convex lenses or a plurality of concave lenses is arranged.

13. The optical member according to claim 10, wherein
a convex-concave surface which has a convex-concave shape and is fit with the convex-concave surface of the reflection member on the side being in contact with the corresponding surface is formed on at least one of the surface of the first base member on the side being in contact with the reflection member and the surface of the second base member on the side being in contact with the reflection member, and
at least one of the convex-concave surfaces formed on the first base member and the second base member has a region in which an angle of inclination is within 45° and which occupies 90% or greater of an effective area in which visible light is incident.

14. The optical member according to claim 10, wherein
a convex-concave surface which has a convex-concave shape and is fit with the convex-concave surface of the reflection member on the side being in contact with the corresponding surface is formed on at least one of the surface of the first base member on the side being in contact with the reflection member and the surface of the second base member on the side being in contact with the reflection member, and
at least one of the convex-concave surfaces formed on the first base member and the second base member has a region in which a width of a concave portion is smaller than 5 μm, and which occupies smaller than 10% of an effective area in which visible light is incident.

15. The optical member according to claim 10, wherein
the selective reflection unit includes a dielectric multi-layer film or a cholesteric-phase liquid crystal layer in which a selective reflection band is set in the visible wavelength range, as the reflection member.

16. An optical member comprising:
a reflection-scattering unit, comprising:
a selective reflection unit that reflects light having wavelength band which corresponds to at least a portion of the visible wavelength range and transmits light having a wavelength band which corresponds to at least a portion of the infrared region, and
a scattering unit that is provided at least on a first side of the selective reflection unit which comprises a convex-concave surface formed on a surface of a cholesteric-phase liquid crystal layer which is a reflection member of the selective reflection unit, on at least the first side, and
refractive indices of a first base member and the cholesteric-phase liquid crystal layer in the wavelength band corresponding to at least the portion of the infrared region are substantially the same as each other, the first base member being in contact with the surface of the reflection member on the first side;
wherein
the first side being an incident side or an emission side of infrared light and being one predetermined side of sides to which visible light is incident,
rectilinear transmittance for the light having the wavelength band which corresponds to at least the portion of the infrared region is equal to or greater than 75%.

17. The optical member according to claim 16,
wherein
the cholesteric-phase liquid crystal layer has a selective reflection band set in the visible wavelength range and a plurality of regions having different aligned axes is provided in a plane.

* * * * *